(12) United States Patent
Doe

(10) Patent No.: US 12,635,394 B2
(45) Date of Patent: May 19, 2026

(54) DISPLAY DEVICE

(71) Applicant: SHARP KABUSHIKI KAISHA, Sakai City (JP)

(72) Inventor: Takahiro Doe, Osaka (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 651 days.

(21) Appl. No.: 18/015,183

(22) PCT Filed: Aug. 7, 2020

(86) PCT No.: PCT/JP2020/030432
§ 371 (c)(1),
(2) Date: Jan. 9, 2023

(87) PCT Pub. No.: WO2022/030005
PCT Pub. Date: Feb. 10, 2022

(65) Prior Publication Data
US 2023/0189620 A1 Jun. 15, 2023

(51) Int. Cl.
*H10K 59/80* (2023.01)
*H10K 50/17* (2023.01)
(Continued)

(52) U.S. Cl.
CPC ... *H10K 59/8794* (2023.02); *H10K 59/80515* (2023.02); *H10K 59/80516* (2023.02);
(Continued)

(58) Field of Classification Search
CPC ......... H10K 59/8794; H10K 59/80515; H10K 59/80516; H10K 59/80521;
(Continued)

(56) References Cited

U.S. PATENT DOCUMENTS

2004/0217701 A1* 11/2004 Kato ..................... H10F 39/189
313/506
2012/0181915 A1* 7/2012 Yamamoto ......... H10K 59/8721
313/46
(Continued)

FOREIGN PATENT DOCUMENTS

JP 2009193801 A 8/2009
WO WO-2016059171 A2 * 4/2016 ........... H10K 50/822

OTHER PUBLICATIONS

Translation for WO 2016059171 A2, "Optoelectronic Assembly and Method for Producing an Optoelectronic Assembly" by Popp et al. (Year: 2015).*

*Primary Examiner* — Jacob Y Choi
*Assistant Examiner* — Ashley Nicole Blackwell
(74) *Attorney, Agent, or Firm* — ScienBiziP, P.C.

(57) ABSTRACT

A display device includes a light-emitting element that includes a first electrode, an second electrode, a light-emitting layer provided between the first electrode and the second electrode, a first function layer provided between the light-emitting layer and the second electrode and in contact with the second electrode, and a first cooling element that includes a third electrode. An extending portion of the second electrode at least partially overlaps the third electrode, and an extending portion of the first function layer overlaps the extending portion of the second electrode and is in contact with the extending portion of the second electrode and the third electrode.

20 Claims, 26 Drawing Sheets

(51) Int. Cl.

| | |
|---|---|
| *H10K 59/12* | (2023.01) |
| *H10K 101/30* | (2023.01) |
| *H10K 102/00* | (2023.01) |

(52) U.S. Cl.
CPC . *H10K 59/80521* (2023.02); *H10K 59/80522*
(2023.02); *H10K 50/171* (2023.02); *H10K
59/12* (2023.02); *H10K 2101/30* (2023.02);
*H10K 2102/351* (2023.02)

(58) Field of Classification Search
CPC ........... H10K 59/80522; H10K 50/171; H10K
59/12; H10K 2101/30; H10K 2102/351;
H10K 2101/40; H10K 50/15; H05B 33/02
See application file for complete search history.

(56) References Cited

U.S. PATENT DOCUMENTS

| | | | | |
|---|---|---|---|---|
| 2020/0235328 A1* | 7/2020 | Shi | ..................... | H10K 59/8794 |
| 2020/0335715 A1* | 10/2020 | Chung | ................. | H10K 71/441 |

* cited by examiner

DISPLAY DEVICE

TECHNICAL FIELD

The disclosure relates to a display device.

BACKGROUND ART

In recent years, organic light emitting diode (OLED) display devices and quantum dot light emitting diode (QLED) display devices have been drawing a great deal of attention. However, it is known that lifetime of the OLED or QLED gets shorter when it is driven at high temperature.

FIG. 26 is a diagram illustrating how the luminance tends to decrease over the driving time, when the OLED or QLED is driven at low temperature and at high temperature.

As in the case of the high-temperature driving illustrated in FIG. 26, in the OLED or QLED, when the temperature increases due to heat generated during the driving, the speed of the luminance decrease increases over the driving time (constant current), and the lifetime of the light-emitting element is shortened, where the driving time in which the luminance becomes equal to or less than a certain level with respect to the initial luminance (90% or less, for example) is defined as the lifetime of the light-emitting element. This is because, in the case of the OLED or QLED, when the temperature increases due to the heat generated during the driving, carrier injection behaviors change mainly due to changes in the bonding state of the organic material, and then, its light-emission characteristics deteriorate from the initial state.

On the other hand, as in the case of the low-temperature driving illustrated in FIG. 26, in the OLED or QLED, when the temperature increase due to the heat generated during the driving can be suppressed, the speed of the luminance drop over the driving time (constant current) slows down, and the lifetime can be extended.

PTL1 describes a technique of cooling the OLED using a Peltier element in order to suppress degradation of the OLED due to heat.

CITATION LIST

Patent Literature

PTL1: JP 2009-193801 A (published on Aug. 27, 2009)

SUMMARY

Technical Problem

However, in PTL1, it is described that the Peltier element is externally provided for a display device that includes the OLED. When the Peltier element is externally provided in this way, the OLED is provided on one side of a substrate or a sealing layer, and the Peltier element is provided on the other side thereof.

Therefore, the Peltier element cools the OLED via the substrate or the sealing layer, and there is thus a problem in that the heat transfer efficiency is poor and the degradation of the OLED due to heat cannot be efficiently suppressed. Further, another problem is that the thickness of the display device is caused to be increased. Furthermore, since the Peltier element is formed in a process separate from a manufacturing process of the OLED, there is a problem in that manufacturing costs of the display device are increased.

An aspect of the disclosure is made in view of the problems described above, and an object of the disclosure is to provide a display device in which degradation of a light-emitting element due to heat can be efficiently suppressed and which can be reduced in thickness and manufactured at lower cost.

Solution to Problem

In order to solve the problems described above, a display device according to the disclosure includes a light-emitting element including a first electrode, a second electrode, a light-emitting layer provided between the first electrode and the second electrode, and a first function layer provided between the light-emitting layer and the second electrode and being in contact with the second electrode; and a first cooling element including a third electrode, an extending portion of the second electrode, the extending portion at least partially overlapping the third electrode, and an extending portion of the first function layer, the extending portion overlapping the extending portion of the second electrode and being in contact with the extending portion of the second electrode and with the third electrode.

Advantageous Effects of Disclosure

According to an aspect of the disclosure, a display device in which degradation of a light-emitting element due to heat can be efficiently suppressed and which can be reduced in thickness and manufactured at lower cost can be provided.

DESCRIPTION OF EMBODIMENTS

Figure 1:
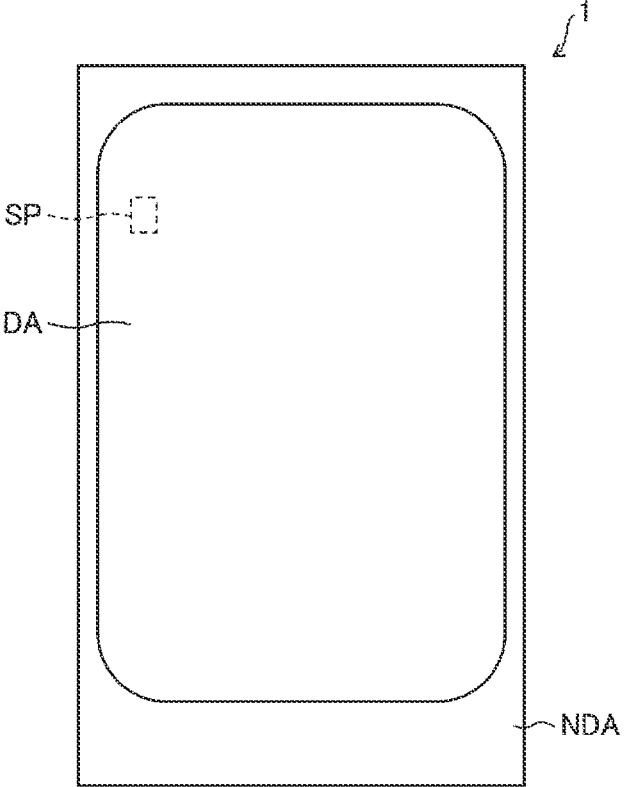
FIG. 1 is a plan view illustrating a display device according to a first embodiment.

Embodiments of the disclosure will be described below with reference to FIG. 1 to FIG. 25. Hereinafter, for convenience of explanation, components having the same functions as those described in a specific embodiment are denoted by the same reference numerals, and descriptions thereof will be omitted.

First Embodiment

FIG. 1 is a plan view illustrating a display device 1 according to a first embodiment.

As illustrated in FIG. 1, the display device 1 includes a display region DA and a frame region NDA around the display region DA. The display region DA includes a plurality of subpixels SP, and each of the plurality of subpixels SP includes a light-emitting element described below. Note that, in the present embodiment, an example will be described in which a red subpixel, a green subpixel, and a blue subpixel, which are the subpixels SP, constitute one pixel, for example, but the configuration is not limited to this example. The one pixel may further include a subpixel other than the red subpixel, the green subpixel, and the blue subpixel, such as a white subpixel and a yellow subpixel.

Figure 2:
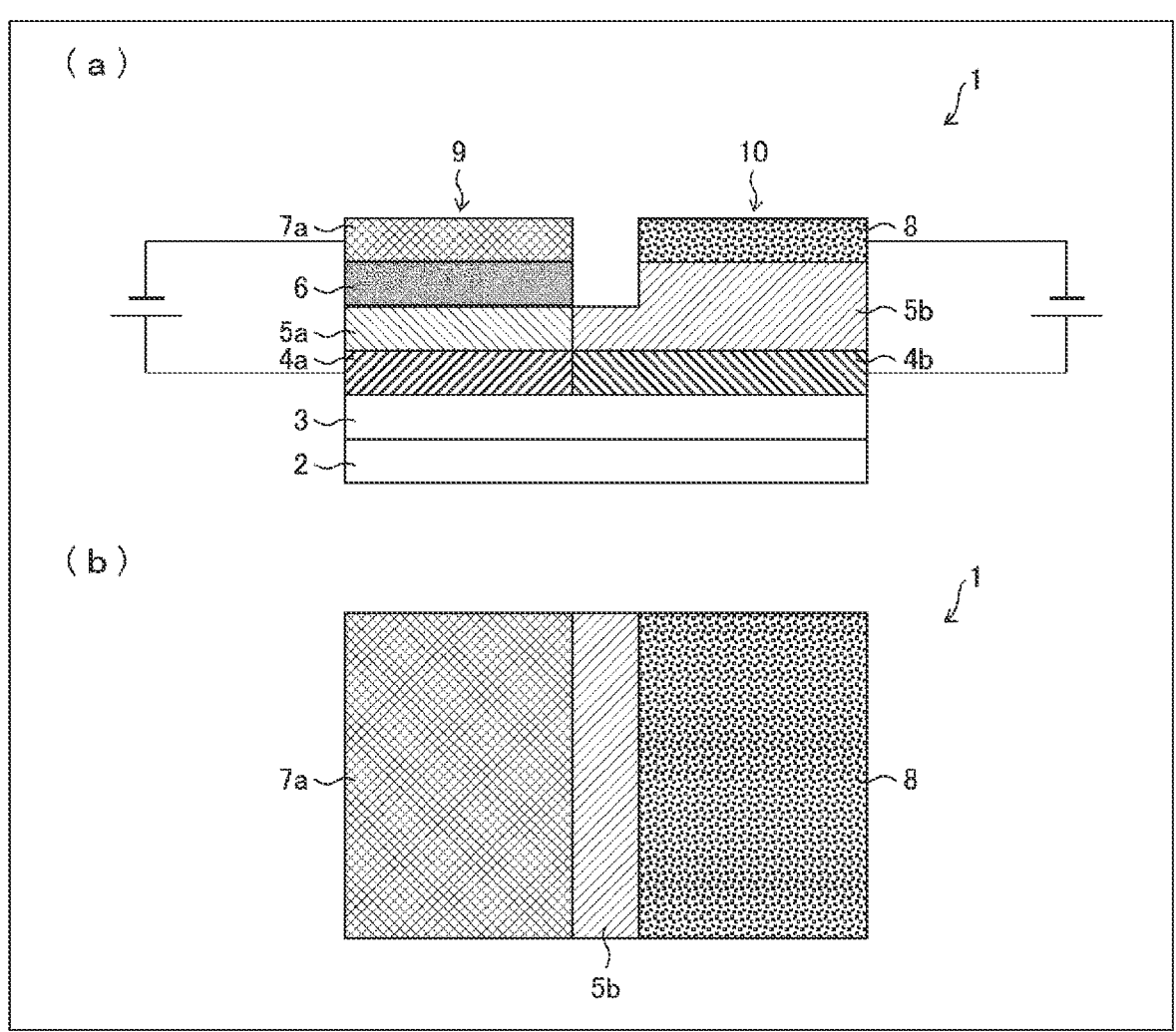
FIG. 2(*a*) is a cross-sectional view illustrating a schematic configuration of a light-emitting element and a first cooling element provided in the display device according to the first embodiment, and FIG. 2(*b*) is a plan view illustrating the light-emitting element and the first cooling element provided in the display device according to the first embodiment.

(a) of FIG. 2 is a cross-sectional view illustrating a schematic configuration of a light-emitting element 9 and a first cooling element 10 provided in the display device 1, and (b) of FIG. 2 is a plan view illustrating the light-emitting element 9 and the first cooling element 10 provided in the display device 1.

As illustrated in (a) of FIG. 2, the display device 1 includes a substrate 2, a thin film transistor (TFT) layer 3, and the light-emitting element 9 and the first cooling element 10 provided on the TFT layer 3.

The substrate 2 may be, for example, a glass substrate, or a flexible substrate containing a resin such as polyimide as a main component.

The TFT layer 3 is a layer including a plurality of thin film transistors, a plurality of capacitance elements, wiring lines for those thin film transistors and capacitance elements, various insulating films, and the like.

Note that, although not illustrated, a barrier layer may be provided between the substrate 2 and the TFT layer 3. The barrier layer is an inorganic insulating layer that prevents penetration of foreign substances such as water or oxygen and can be formed using, for example, silicon nitride, silicon oxide, or the like.

The light-emitting element 9 provided on the TFT layer 3 includes an anode (second electrode) 4a, a cathode (first electrode) 7a, a light-emitting layer 6 provided between the anode 4a and the cathode 7a, and a hole injection layer (first function layer) 5a provided between the light-emitting layer 6 and the anode 4a and being in contact with the anode 4a.

The first cooling element 10 provided on the TFT layer 3 includes a heat radiating electrode (third electrode) 8, and an extending portion 4b of the anode (second electrode) at least partially overlapping the heat radiating electrode 8, and an extending portion 5b of the hole injection layer (first function layer) overlapping the extending portion 4b of the anode and being in contact with the extending portion 4b of the anode and the heat radiating electrode 8.

The extending portion 4b of the anode is formed by extending the anode 4a, and thus, the anode 4a and the extending portion 4b of the anode are formed of the same material and also electrically connected to each other.

Further, the extending portion 5b of the hole injection layer is formed by extending the hole injection layer 5a, and thus, the hole injection layer 5a and the extending portion 5b of the hole injection layer are formed of the same material.

Note that the anode 4a and the extending portion 4b of the anode are electrically connected to a drain electrode of a TFT element (not illustrated) provided in the TFT layer 3 via a contact hole, for example.

In the display device 1 according to the present embodiment, the hole injection layer 5a is formed to a film thickness from 10 nm to 100 nm and the extending portion 5b of the hole injection layer sandwiched between the extending portion 4b of the anode and the heat radiating electrode 8 is formed to a film thickness from 1 μm to 100 μm so that both the film thickness of the hole injection layer 5a provided in the light-emitting element 9 and the film thickness of the extending portion 5b of the hole injection layer provided in the first cooling element 10 are optimal for the respective elements, but the configuration is not limited to this example. For example, the film thickness of the hole injection layer 5a and the film thickness of the extending portion 5b of the hole injection layer may be set outside the range described above, the film thickness of the hole injection layer 5a and the film thickness of the extending portion 5b of the hole injection layer may be the same, or the hole injection layer 5a may be formed thicker than the extending portion 5b of the hole injection layer.

The heat radiating electrode 8 is preferably at least partially exposed to the air. In the present embodiment, an example is described in which as illustrated in (a) and (b) of FIG. 2, the upper surface of the heat radiating electrode 8 facing the lower surface of the heat radiating electrode 8 is completely exposed to the air, the lower surface being in contact with the extending portion 5b of the hole injection layer. However, the configuration is not limited to this example.

The display device 1 preferably further includes a sealing layer (not illustrated) provided on the light-emitting element 9 and the first cooling element 10. In a case where the sealing layer is provided in this manner, an opening may be provided in the sealing layer overlapping the heat radiating electrode 8, such that the heat radiating electrode 8 is at least partially exposed to the air. Alternatively, a conductive member (a wiring line, for example) electrically connected to the heat radiating electrode 8 may be exposed to the air in the frame region NDA illustrated in FIG. 1.

Note that, in the display device 1 according to the present embodiment, as illustrated in (a) of FIG. 2, an air layer is formed between the light-emitting layer 6 and the heat radiating electrode 8, in order to electrically and thermally isolate (insulate) the heat radiating electrode 8, which radiates heat, from the light-emitting layer 6, which is an object to be cooled. A formation method of such an air layer is not particularly limited, but in the present embodiment, first, the hole injection layer 5a and the extending portion 5b of the hole injection layer are formed to the film thickness of the extending portion 5b of the hole injection layer overlapping the heat radiating electrode 8, which is the thicker film thickness. After that, a resist film is formed so as to cover only the extending portion 5b of the hole injection layer overlapping the heat radiating electrode 8, which is formed in a post process. Then, by removing, using this resist film as a mask, a portion of the film over which the resist film is not formed, the film thickness of the extending portion 5b of the hole injection layer not overlapping the heat radiating electrode 8 and the film thickness of the hole injection layer 5a can be made thinner than the film thickness of the extending portion 5b of the hole injection layer overlapping the heat radiating electrode 8, as illustrated in (a) of FIG. 2. Subsequently, after removing the resist film, by forming the light-emitting layer 6 on the hole injection layer 5a and forming the heat radiating electrode 8 on the thick film portion of the extending portion 5b of the hole injection layer, the air layer can be formed between the light-emitting layer 6 and the heat radiating electrode 8, as illustrated in (a) of FIG. 2.

The cathode 7a is an electrode that injects electrons into the light-emitting layer 6 provided in the light-emitting element 9, and can be formed of a single layer made of any one of Al, Ag, and indium tin oxide (ITO), or a layered body in which a plurality of single layers made of different materials are layered, for example. When the display device 1 is a top-emitting display device, the cathode 7a may be formed of a metal thin film or ITO to function as an electrode that transmits visible light, and when the display device 1 is a bottom-emitting display device, the cathode 7a may be formed of a metal film to function as an electrode that reflects visible light.

The anode 4a and the extending portion 4b of the anode are a common electrode that is continuous from the light-emitting element 9 to the first cooling element 10. The anode 4a is an electrode that injects holes into the hole injection layer 5a and the light-emitting layer 6 provided in the light-emitting element 9, and the extending portion 4b of the anode is an electrode that injects holes into the extending portion 5b of the hole injection layer provided in the first cooling element 10 to generate a Peltier effect. The material of the anode 4a and the extending portion 4b of the anode can be determined appropriately in accordance with the material of the cathode 7a, and can be formed of a single layer made of any one of Al, Ag, and ITO, or a layered body in which a plurality of single layers made of different materials, for example. When the display device 1 is a top-emitting display device, the anode 4a may be formed of a metal film to function as an electrode that reflects the visible light, and when the display device 1 is a bottom-emitting display device, the anode 4a may be formed of a metal thin film or ITO to function as an electrode that transmits visible light.

The hole injection layer 5a and the extending portion 5b of the hole injection layer can be constituted by a p-type semiconductor. The hole injection layer 5a serves as a layer that effectively injects holes into the light-emitting layer 6 provided in the light-emitting element 9, and the extending portion 5b of the hole injection layer provided between the heat radiating electrode 8 and the extending portion 4b of the anode so as to be in contact with the heat radiating electrode 8 and the extending portion 4b of the anode serves as a material that exhibits the Peltier effect by which the anode 4a and the extending portion 4b of the anode are cooled and the heat radiating electrode 8 is heated.

The Peltier performance of the hole injection layer 5a and the extending portion 5b of the hole injection layer is expressed by a Peltier performance index ZT indicated in Expression 1 below, and the higher ZT, the better the Peltier performance.

[Expression 1]

$$ZT = \frac{S^2 \sigma T}{\kappa} \qquad \text{(Expression 1)}$$

In Expression 1 described above, ZT, which is the Peltier performance index, is a performance index of thin films made of respective materials, S is a Seebeck coefficient, is electrical conductivity, T is absolute temperature, and $\kappa$ is thermal conductivity. In order to improve ZT, an increase in the electrical conductivity or a decrease in the thermal conductivity is required, but the optimal film thickness changes depending on material properties. For example, in NPL [Nat. Mater. 10, 429 (2011)], it is described that, by introducing a tosyl group to PEDOT as the p-type semiconductor material of the hole injection layer, the thermal conductivity $\kappa$ is set to 0.33 W/mK at room temperature, and ZT becomes 0.25 at a film thickness of 1.6 μm. Typically, an oxide semiconductor having a wide band gap exhibits a high ZT at a high temperature, but there is a problem in that the oxide semiconductor has a low ZT at room temperature. Further, a semiconductor material made of a heavy metal exhibiting a high ZT at room temperature has a problem of having a narrow band gap and absorbing emitted light. Therefore, it is not preferable to use those materials as the hole injection layer.

Thus, in the present embodiment, the hole injection layer 5a and the extending portion 5b of the hole injection layer, which are a p-type semiconductor layer, are preferably formed using the following materials.

Examples of the organic material that can effectively inject holes into the light-emitting layer 6 provided in the light-emitting element 9 and exhibits the Peltier effect include poly-3,4-ethylenedioxythiophene (PEDOT), polyaniline, polyacetylene, polyphenylene, polyfuran, polyselenophene, polythiophene, polyacene, polyisothianaphthene, polyphenylene sulfide, polyphenylene vinylene, polythiophene vinylene, polyperinaphthalene, polyanthracene, polynaphthalene, polypyrene, polyazulene, polypyrrole, polyparaphenylene, poly(benzobisimidazobenzophenanthroline), organic boron-containing polymers, polytriazole, pyrene, carbazole, triarylamine, tetrathiafulvalene, derivatives of these materials, and copolymers of these materials. Note that, from the perspective of including an organic hole injection layer having a high Peltier performance index ZT and enabling fabrication of the display device 1 having a higher cooling efficiency, the hole injection layer 5a and the extending portion 5b of the hole injection layer preferably contain at least one or more selected from the group consisting of PEDOT, PVK (poly (N-vinylcarbazole)), m-MTDATA (4,4',4"-tris[(3-methylphenyl)phenylamino]triphenylamine), TDATA (4,4',4"- tris(N,N-diphenylamino)triphenylamine), PANI (polyaniline), poly-TPD (poly[N,N'-bis(4-butylphenyl)-N,N'-bis(phenyl)benzidine]), and DPAB (4,4'-bis[N-(4-diphenylaminophenyl)-N-phenylamino]biphenyl).

Further, the hole injection layer 5a and the extending portion 5b of the hole injection layer which can effectively inject holes into the light-emitting layer 6 provided in the light-emitting element 9 and which are formed of an inorganic material having a high Peltier performance index ZT preferably contain at least one or more selected from the group consisting of lithium cobalt oxide (LiCoO$_2$, for example), lithium nickel oxide (LiNiO$_2$, for example), sodium cobalt oxide (NaCo$_2$O$_4$, for example), sodium nickel oxide, potassium cobalt oxide, potassium nickel oxide, magnesium cobalt oxide, magnesium nickel oxide, calcium cobalt oxide (Ca$_3$Co$_4$O$_9$, for example), and calcium nickel oxide.

The light-emitting layer 6 provided in the light-emitting element 9 is a layer that emits light as a result of recombination of the holes injected from the anode 4a via the hole injection layer 5a and the electrons injected from the cathode 7a. The light-emitting layer 6 can be formed of a light-emitting material made of an organic material (such as Alq3 as a low molecular material and MEH-PPV as a high molecular material), or an inorganic material (ZnCdSeS-based quantum dots, InP-based quantum dots, CIS-based quantum dots, or the like). In other words, the light-emitting element 9 may be an organic light-emitting diode (OLED) or a quantum dot light-emitting diode (QLED). Further, all of the plurality of light-emitting elements 9 provided in the display device 1 may be OLEDs, all of them may be QLEDs, or some of them may be OLEDs while the others are QLEDs.

The heat radiating electrode 8 is an electrode that is used for applying a voltage to the extending portion 5b of the hole injection layer independently of the light-emitting element 9, in order to cool the anode 4a and the extending portion 4b of the anode, using the Peltier effect of the extending portion 5b of the hole injection layer. The heat radiating electrode 8 may be formed of the same material as the cathode 7a or anode 4a described above, or may be formed of a metal material such as Zn, Sn, W, and Ti, for example. From the perspective of the heat radiation performance of the heat radiating electrode 8, a metal material having a high emissivity is preferably used as the heat radiating electrode 8.

The light-emitting element 9 provided in the display device 1 according to the present embodiment may further include a hole transport layer between the hole injection layer 5a and the light-emitting layer 6, and may further include at least one of an electron transport layer and an electron injection layer between the light-emitting layer 6 and the cathode 7a.

Figure 3:
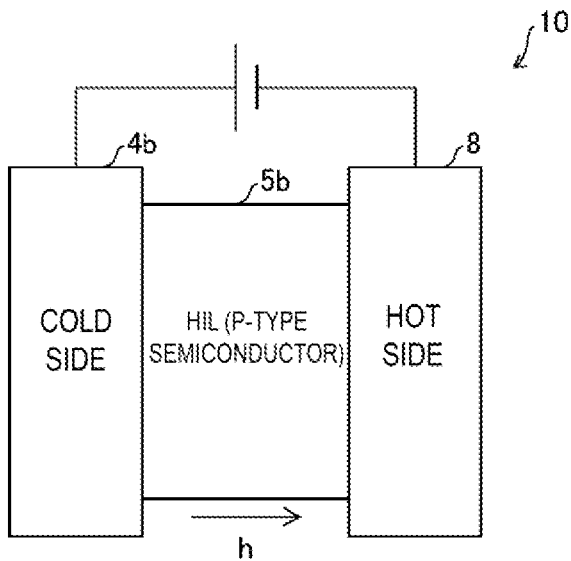
FIG. 3 is a diagram illustrating the first cooling element provided in the display device according to the first embodiment, at a time of being driven.

FIG. 3 is a diagram illustrating the first cooling element 10 provided in the display device 1, at a time of being driven.

As illustrated in FIG. 3, when a voltage is applied between the extending portion 4b of the anode and the heat radiating electrode 8 and holes h are injected into the extending portion 5b of the hole injection layer (HIL), which is the p-type semiconductor, from the extending portion 4b of the anode, the extending portion 5b of the hole injection layer serves as a material that exhibits the Peltier effect by which the anode 4a and the extending portion 4b of the anode are cooled and the heat radiating electrode 8 is heated. Thus, the extending portion 4b of the anode becomes the cold side, and the heat radiating electrode 8 becomes the hot side.

Figure 4:
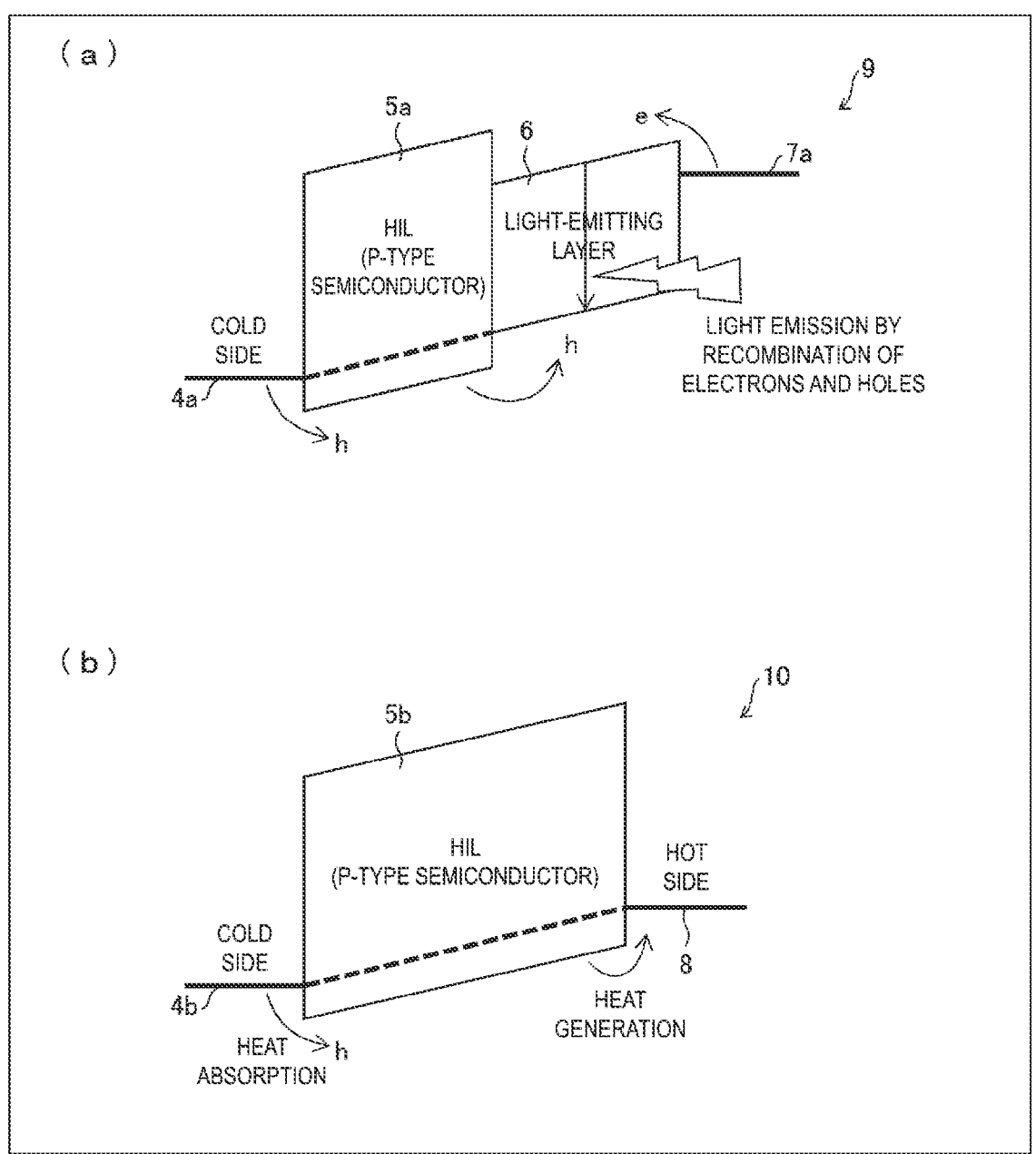
FIG. 4(*a*) is a band diagram of the light-emitting element provided in the display device according to the first embodiment, and FIG. 4(*b*) is a band diagram of the first cooling element provided in the display device according to the first embodiment.

(a) of FIG. 4 is a band diagram of the light-emitting element 9 provided in the display device 1, and (b) of FIG. 4 is a band diagram of the first cooling element 10 provided in the display device 1.

Note that the lower end of the band of the hole injection layer 5a illustrated in (a) of FIG. 4 is the valence band level of the hole injection layer 5a, and the upper end of the band of the hole injection layer 5a illustrated in (a) of FIG. 4 is the conduction band level thereof. Further, the lower end of the band of the light-emitting layer 6 illustrated in (a) of FIG. 4 is the valence band level of the light-emitting layer 6, and the upper end of the band of the light-emitting layer 6 illustrated in (a) of FIG. 4 is the conduction band level thereof. Further, the lower end of the band of the extending portion 5b of the hole injection layer illustrated in (b) of FIG. 4 is the valence band level of the extending portion 5b of the hole injection layer, and the upper end of the band of the extending portion 5b of the hole injection layer illustrated in (b) of FIG. 4 is the conduction band level thereof.

As illustrated in (a) of FIG. 4, when a voltage is applied between the anode 4a and the cathode 7a in order to cause the light-emitting element 9 to emit light, a portion of the energy is converted to heat in the light-emitting layer 6 and the hole injection layer 5a, and thus the temperature of the light-emitting element 9 including the light-emitting layer 6 is caused to increase. The display device 1 according to the present embodiment includes the first cooling element 10 that suppresses the temperature increase of the light-emitting element 9. In the first cooling element 10, as illustrated in (b) of FIG. 4, when the holes h are injected into the extending portion 5b of the hole injection layer (HIL), which is the p-type semiconductor, from the extending portion 4b of the anode, the extending portion 5b of the hole injection layer (HIL) absorbs heat of the extending portion 4b of the anode and generates (radiates) heat to the heat radiating electrode 8 due to the Peltier effect. Therefore, the extending portion 4b of the anode becomes the cold side and the anode 4a is also the cold side; thus, the heat generated in the light-emitting layer 6 and the hole injection layer 5a can be released via the anode 4a, the extending portion 4b of the anode, and the heat radiating electrode 8.

Further, as described above, in the present embodiment, the hole injection layer 5a provided in the light-emitting element 9 is formed to a film thickness from 10 nm to 100 nm such that the hole injection layer 5a is a layer thinner than the extending portion 5b of the hole injection layer that has a film thickness of 1 μm to 100 μm. Thus, the heat generated in the light-emitting layer 6 diffuses very fast in the hole injection layer 5a.

Note that, from the perspective of including the hole injection layer 5a, which only absorbs a small amount of light in a visible light region emitted from the light-emitting layer 6, the band gap of the hole injection layer 5a (the difference between the lower end and the upper end of the band of the hole injection layer 5a illustrated in (a) of FIG. 4) is preferably 1.9 eV or greater.

Further, when the anode 4a and the extending portion 4b of the anode are each formed of the single layer made of any one of Al, Ag, and ITO, or the layered body in which the plurality of single layers made of different materials are layered, in order to obtain the Peltier effect, the absolute value of the valence band level of the extending portion 5b of the hole injection layer (the lower end of the band of the extending portion 5b of the hole injection layer illustrated in (b) of FIG. 4) needs to be 4.5 eV or greater.

Further, when the absolute value of the valence band level of the hole injection layer 5a and the extending portion 5b of the hole injection layer is 4.5 eV or greater, the work functions of the anode 4a and the extending portion 4b of the anode are preferably from 4.1 eV to 4.8 eV. Further, the work function of the heat radiating electrode 8 is preferably smaller than the absolute value of the valence band level of the hole injection layer 5a and the extending portion 5b of the hole injection layer (4.5 eV or greater).

Figure 5:
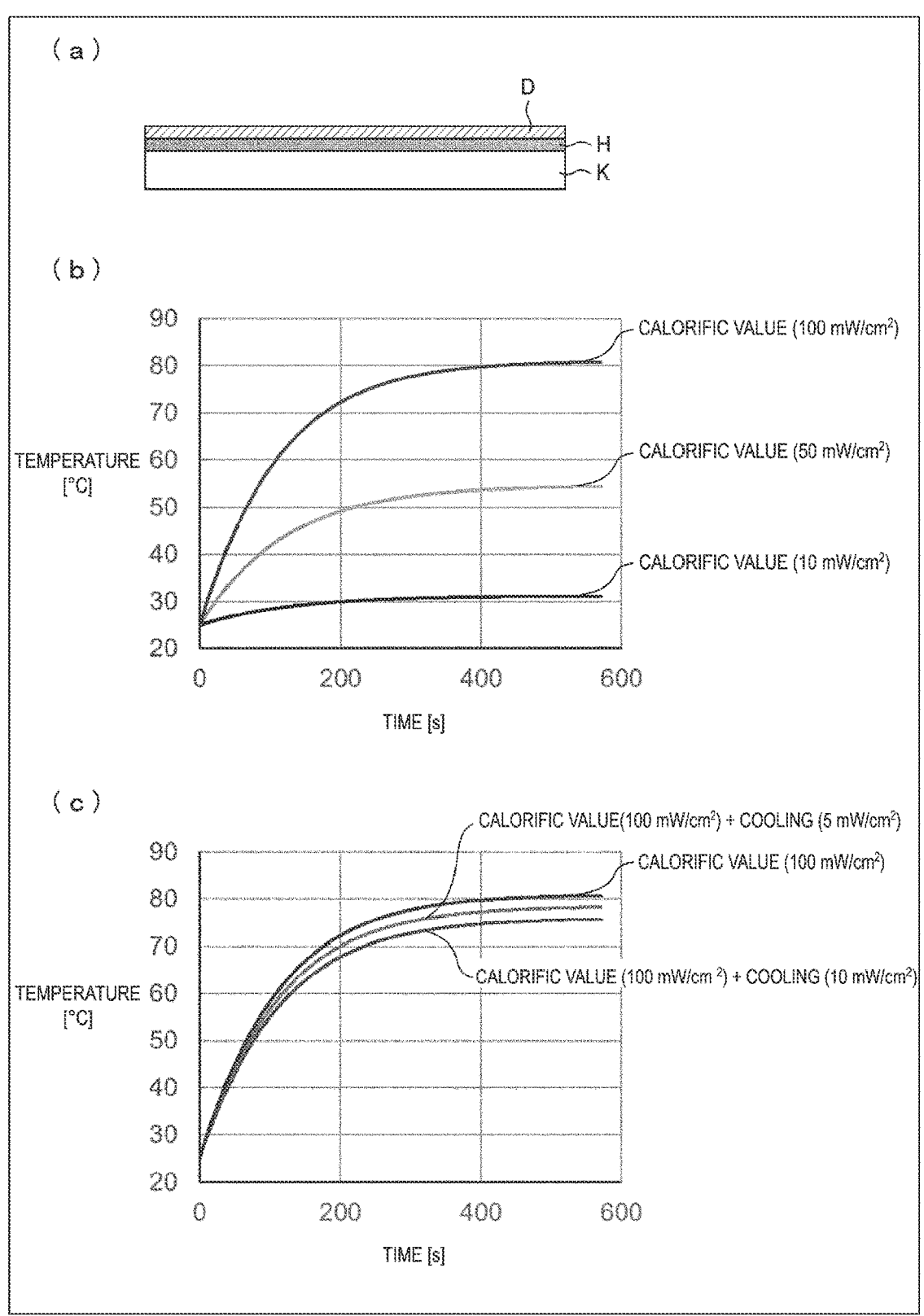
FIG. 5(*a*) is a diagram illustrating a schematic configuration of a model element that is used for calculations and is provided with a light-emitting layer, FIG. 5(*b*) is a diagram showing calculation results of temperature changes in the model element when calorific values are generated in the model element, in a case where there is no cooling effect, and FIG. 5(*c*) is a diagram showing calculation results of the temperature changes in the model element when there is no cooling effect, when the cooling effect is 5 mW/cm², and when the cooling effect is 10 mW/cm², in a case where a calorific value of 100 mW/cm² is generated in the model element.

(a) of FIG. 5 is a diagram illustrating a schematic configuration of a model element that is used for calculations and is provided with a light-emitting layer H.

As illustrated in (a) of FIG. 5, the model element that is used for the calculations and is provided with the light-emitting layer H is constituted by layering the light-emitting layer H and an Al layer D such that they have a thickness of 100 nm, on a glass substrate κ having a thickness of 0.5 mm. Note that, when the thickness of the layered body of the light-emitting layer H and the Al layer D is from 10 nm to 1 μm, the thickness dependency of the layered body can be ignored in the calculation results.

(b) of FIG. 5 is a diagram showing calculation results of temperature changes in the model element when calorific values of 10 mW/cm$^2$, 50 mW/cm$^2$, and 100 mW/cm$^2$ are generated in the model element illustrated in (a) of FIG. 5, in a case where there is no cooling effect. Note that all of the results of the temperature changes shown here are results obtained by calculating the temperature of the Al layer D disposed close to the light-emitting layer H, and the difference between the temperature of the Al layer D and the temperature of the glass substrate κ having a thickness of 0.5 mm was 1° C. or lower.

In a light-emitting element, heat is generated due to the Joule heat arising from the series resistance of each layer, the electrical resistance of the interlayer interface, and the contact resistance between electrodes, non-light-emitting recombination of injected electrons and holes, and absorption of the emitted light by each of the layers. In a typical surface-emitting element, for example, of input power (voltage×current), the energy that can be extracted as light is only 20% because of a light extraction efficiency that is limited by a refractive index difference between the air and the light-emitting element, and the remaining 80% is turned into heat due to the reasons described above.

In the display device 1 according to the present embodiment, for the same reasons described above, the calorific value is large when the light-emitting element 9 is being driven, and this causes the temperature increase of the light-emitting element 9. Thus, the first cooling element 10 is provided in order to suppress the temperature increase of the light-emitting element 9. In the first cooling element 10, due to the Peltier effect obtained when the current is caused to flow into the extending portion 5b of the hole injection layer, which is in contact with the extending portion 4b of the anode and the heat radiating electrode 8, a temperature difference is generated between the extending portion 4b of the anode and the heat radiating electrode 8, and the extending portion 4b of the anode is cooled. The cooled extending portion 4b of the anode cools the anode 4a provided in the light-emitting element 9 via heat transfer, and thus, the light-emitting layer 6 and the hole injection layer 5a provided in the light-emitting element 9 can be cooled. As a result, it is possible to cool the light-emitting element 9. Further, as illustrated in (a) of FIG. 2, because the heat radiating electrode 8 generates heat, by exposing the heat radiating electrode 8 to the atmosphere to air-cool the heat radiating electrode 8, the temperature of the anode 4a and the extending portion 4b of the anode can be further lowered.

Note that, in the first cooling element 10, there is an optimal value of the current flowing through the extending portion 5b of the hole injection layer. This is because the larger the current amount, the more the cooling performance due to the Peltier effect, that is, the temperature difference between the extending portion 4b of the anode and the heat radiating electrode 8, increases. However, since the Joule heat arising from the resistance of the extending portion 5b of the hole injection layer also increases as the current amount increases, the extending portion 5b of the hole injection layer itself generates heat, which causes the cooling performance to deteriorate. Due to the reasons described above, the optimal value of the current that is caused to flow through the extending portion 5b of the hole injection layer differs depending on the thickness and material properties of the extending portion 5b of the hole injection layer. Thus, in the first cooling element 10 provided in the display device 1 according to the present embodiment, the current that is caused to flow through the extending portion 5b of the hole injection layer can be adjusted to be optimal by adjusting the voltage of the heat radiating electrode 8.

In the display device 1 according to the present embodiment, the voltage is applied between the anode 4a and the cathode 7a to drive the light-emitting element 9 and a light emission amount of the light-emitting element 9 is controlled, and also, the current flowing between the extending portion 4b of the anode and the heat radiating electrode 8 can be controlled by adjusting the voltage of the heat radiating electrode 8. Thus, a cooling amount of the first cooling element 10 can be appropriately adjusted in accordance with the calorific value of the light-emitting element 9.

(c) of FIG. 5 is a diagram showing calculation results of the temperature changes in the model element when there is no cooling effect, when the cooling effect is 5 mW/cm², and when the cooling effect is 10 mW/cm², in a case where a calorific value of 100 m W/cm² is generated in the model element.

As illustrated in (c) of FIG. 5, compared with the case where there is no cooling effect, when there is a cooling effect, that is, when the Peltier effect is obtained, it is possible to lower the temperature which the model element reaches after a predetermined time period.

In the display device 1 according to the present embodiment, the light-emitting element 9 can be cooled using the first cooling element 10, and it is thus possible to lower the temperature which the light-emitting element 9 reaches after the predetermined time period for each of the calorific values. Note that, in such a case, the temperature of the heat radiating electrode 8 changes due to the area of the electrode, the emissivity of the electrode material, and thermal convection of the atmosphere, but the temperature of the heat radiating electrode 8 can be higher than the temperature of the anode 4a and the extending portion 4b of the anode by 0.1° C. or more. Further, in such a case, as in the case of the display device 1, when the thickness of the light-emitting layer 6 is relatively thin, there is substantially no difference between the temperature of anode 4a and the extending portion 4b of the anode and the temperature of the cathode 7a, and even if there is a difference, the difference is less than 0.1° C. Thus, the temperature of the heat radiating electrode 8 can be higher than the temperature of the cathode 7a. In other words, the temperature of the heat radiating electrode 8 can be higher than at least one of the temperature of the anode 4a and the temperature of the cathode 7a.

Figure 6:
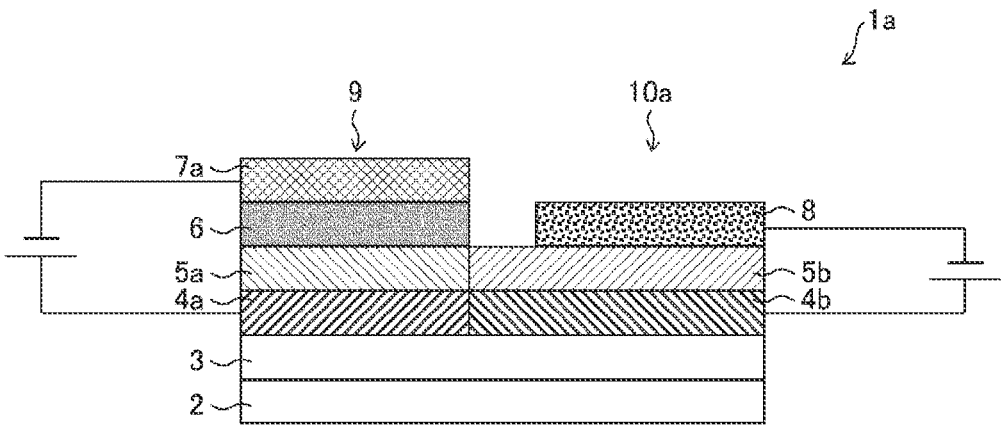
FIG. 6 is a cross-sectional view illustrating a schematic configuration of a light-emitting element and a first cooling element provided in a display device according to a modified example of the first embodiment.

FIG. 6 is a cross-sectional view illustrating a schematic configuration of the light-emitting element 9 and a first cooling element 10a provided in a display device 1a according to a modified example of the first embodiment.

As illustrated in FIG. 6, the display device 1a is different from the display device 1 illustrated in (a) of FIG. 2 described above in that, in the display device 1a, the film thickness of the hole injection layer 5a provided in the light-emitting element 9 is the same as the film thickness of the extending portion 5b of the hole injection layer provided in the first cooling element 10a. Compared with a case where the hole injection layer 5a and the extending portion 5b of the hole injection layer are formed to have different film thicknesses from each other, when the hole injection layer 5a and the extending portion 5b of the hole injection layer are formed to have the same film thickness, the hole injection layer 5a and the extending portion 5b of the hole injection layer can be formed in a shorter process.

Note that, in the display device 1, 1a, for example, a driving period of the light-emitting element 9 may match with a driving period of the first cooling element 10, 10a, or a pause period of the light-emitting element 9 may match with the driving period of the first cooling element 10, 10a. However, the configuration is not limited to this example.

In the display device 1, 1a, the first cooling element 10, 10a can be driven as a Peltier element to cool the extending portion 4b of the anode and also to cause the heat radiating electrode 8 to generate heat. Then, in the light-emitting element 9, the light-emitting layer 6 and the hole injection layer 5a can be cooled by heat transfer via the anode 4a, and thus degradation of the light-emitting layer 6 and the hole injection layer 5a due to heat, that is, degradation of the light-emitting element 9 due to heat can be efficiently suppressed. Further, in accordance with the calorific value of the light-emitting element 9, the cooling amount of the first cooling element 10, 10a can be appropriately adjusted.

Further, in the display device 1, 1a, the first cooling element 10, 10a includes the extending portion 4b of the anode and the extending portion 5b of the hole injection layer, which are formed by extending the anode 4a and the hole injection layer 5a provided in the light-emitting element 9, respectively. Therefore, it is not necessary to prepare the first cooling element 10, 10a and the light-emitting element 9 separately and assemble them together, and thus, a reduction in the manufacturing costs of the display device 1, 1a and a reduction in the thickness of the display device 1, 1a can be achieved.

Second Embodiment

Next, a second embodiment of the disclosure will be described with reference to FIGS. 7 to 10. The present embodiment is different from the first embodiment in that a light-emitting element 9a provided in a display device 1b, 1c of the present embodiment is provided with an electron injection layer 15a and a first cooling element 10b, ·10c is provided with an extending portion 15b of the electron injection layer. Other configurations are as described in the first embodiment. For convenience of explanation, components having the same functions as those described in diagrams of the first embodiment are denoted by the same reference numerals, and descriptions thereof will be omitted.

Figure 7:
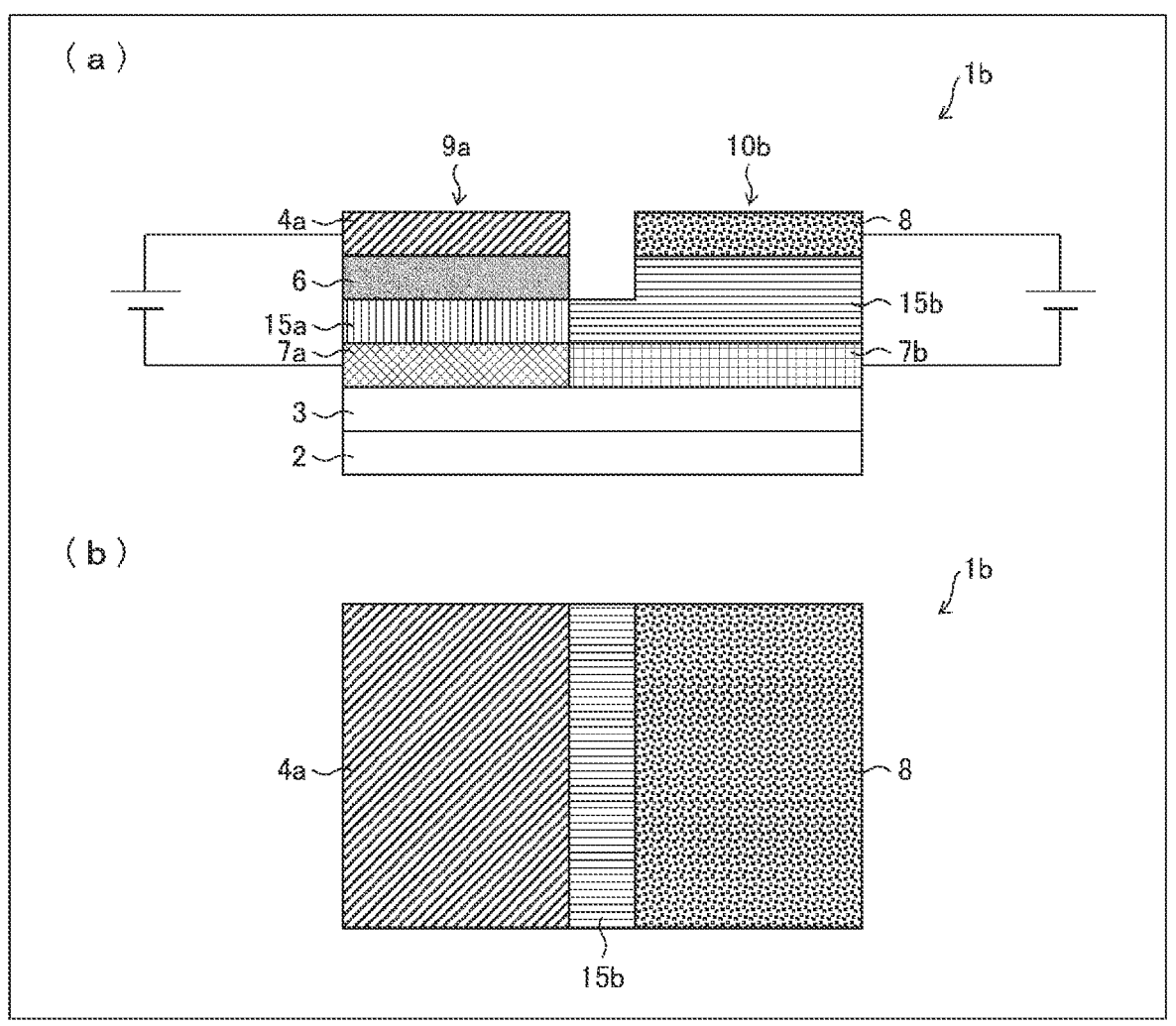
FIG. 7(*a*) is a cross-sectional view illustrating a schematic configuration of a light-emitting element and a first cooling element provided in a display device according to a second embodiment, and FIG. 7(*b*) is a plan view illustrating the light-emitting element and the first cooling element provided in the display device according to the second embodiment.

(a) of FIG. 7 is a cross-sectional view illustrating a schematic configuration of the light-emitting element 9a and the first cooling element 10b provided in the display device 1b, and (b) of FIG. 7 is a plan view illustrating the light-emitting element 9a and the first cooling element 10b provided in the display device 1b.

As illustrated in (a) of FIG. 7, the display device 1*b* includes the substrate 2, the TFT layer 3, and the light-emitting element 9*a* and the first cooling element 10*b* provided on the TFT layer 3.

The light-emitting element 9*a* provided on the TFT layer 3 includes the anode (first electrode) 4*a*, the cathode (second electrode) 7*a*, the light-emitting layer 6 provided between the anode 4*a* and the cathode 7*a*, and the electron injection layer (first function layer) 15*a* provided between the light-emitting layer 6 and the cathode 7*a* and being in contact with the cathode 7*a*.

The first cooling element 10*b* provided on the TFT layer 3 includes the heat radiating electrode (third electrode) 8, an extending portion 7*b* of the cathode 7*a* (second electrode) at least partially overlapping the heat radiating electrode 8, and the extending portion 15*b* of the electron injection layer (first function layer) overlapping the extending portion 7*b* of the cathode and being in contact with the extending portion 7*b* of the cathode and the heat radiating electrode 8.

Since the extending portion 7*b* of the cathode is formed by extending the cathode 7*a*, the cathode 7*a* and the extending portion 7*b* of the cathode are formed of the same material and electrically connected to each other.

Further, the extending portion 15*b* of the electron injection layer is formed by extending the electron injection layer 15*a*, and thus the electron injection layer 15*a* and the extending portion 15*b* of the electron injection layer are formed of the same material.

Note that the cathode 7*a* and the extending portion 7*b* of the cathode are electrically connected to the drain electrode of the TFT element (not illustrated) provided in the TFT layer 3 via a contact hole, for example.

In the display device 1*b* according to the present embodiment, the electron injection layer 15*a* is formed to a film thickness from 10 nm to 100 nm and the extending portion 15*b* of the electron injection layer sandwiched between the extending portion 7*b* of the cathode and the heat radiating electrode 8 is formed to a film thickness from 1 µm to 100 µm, so that the film thickness of the electron injection layer 15*a* provided in the light-emitting element 9*a* and the film thickness of the extending portion 15*b* of the electron injection layer provided in the first cooling element 10*b* are optimal for the respective elements, but the configuration is not limited to this example. For example, the film thickness of the electron injection layer 15*a* and the film thickness of the extending portion 15*b* of the electron injection layer may be set outside the range described above, the film thickness of the electron injection layer 15*a* and the film thickness of the extending portion 15*b* of the electron injection layer may be the same, or the film thickness of the electron injection layer 15*a* may be thicker than the film thickness of the extending portion 15*b* of the electron injection layer.

The heat radiating electrode 8 is preferably at least partially exposed to the air. In the present embodiment, as illustrated in (a) and (b) of FIG. 7, an example is described in which the upper surface of the heat radiating electrode 8 facing the lower surface of the heat radiating electrode 8 is completely exposed to the air, the lower surface being in contact with the extending portion 15*b* of the electron injection layer. However, the configuration is not limited to this example.

Note that, in the display device 1*b* according to the present embodiment, as illustrated in (a) of FIG. 7, an air layer is formed between the light-emitting layer 6 and the heat radiating electrode 8 in order to electrically and thermally isolate (insulate) the heat radiating electrode 8 that radiates heat, from the light-emitting layer 6, which is an object to be cooled. The formation method of the air layer is not particularly limited, but the method described above in the first embodiment can be used.

The electron injection layer 15*a* and the extending portion 15*b* of the electron injection layer can be constituted by an n-type semiconductor. The electron injection layer 15*a* serves as a layer that effectively injects electrons into the light-emitting layer 6 provided in the light-emitting element 9*a*, and the extending portion 15*b* of the electron injection layer provided between the heat radiating electrode 8 and the extending portion 7*b* of the cathode so as to be in contact with the heat radiating electrode 8 and the extending portion 7*b* of the cathode serves as a material that exhibits the Peltier effect by which the cathode 7*a* and the extending portion 7*b* of the cathode are cooled and the heat radiating electrode 8 is heated.

The Peltier performance of the electron injection layer 15*a* and the extending portion 15*b* of the electron injection layer is expressed by the Peltier performance index ZT indicated in Expression 1 described above, and the higher ZT, the better the Peltier performance. For example, in NPL [Nano Lett. 2011, 11, 4337], it is described that, regarding the n-type semiconductor material of the electron injection layer, the thermal conductivity $\kappa$ of ZnO that is Al-doped at 1000° C. is 2 W/mK, and ZT thereof is 0.44. Typically, an oxide semiconductor having a wide band gap exhibits a high ZT at a high temperature, but there is a problem that the oxide semiconductor has a low ZT at room temperature. Further, a semiconductor material made of a heavy metal exhibiting a high ZT at room temperature has a problem of having a narrow band gap and absorbing emitted light. Therefore, it is not preferable to use those materials as the electron injection layer.

Thus, in the present embodiment, the electron injection layer 15*a* and the extending portion 15*b* of the electron injection layer, which are an n-type semiconductor layer, are preferably formed using the following materials.

The electron injection layer 15*a* and the extending portion 15*b* of the electron injection layer, which can effectively inject electrons into the light-emitting layer 6 provided in the light-emitting element 9*a* and which favorably exhibits the Peltier effect, are preferably constituted by at least one of $Al_xZn_{1-x}O$, $Ga_xZn_{1-x}O$, and $In_xZn_{1-x}O$ (X is from 0.01 to 0.9).

The light-emitting element 9*a* provided in the display device 1*b* according to the present embodiment may further include an electron transport layer between the electron injection layer 15*a* and the light-emitting layer 6, and may further include at least one of a hole transport layer and a hole injection layer between the light-emitting layer 6 and the anode 4*a*.

Figure 8:
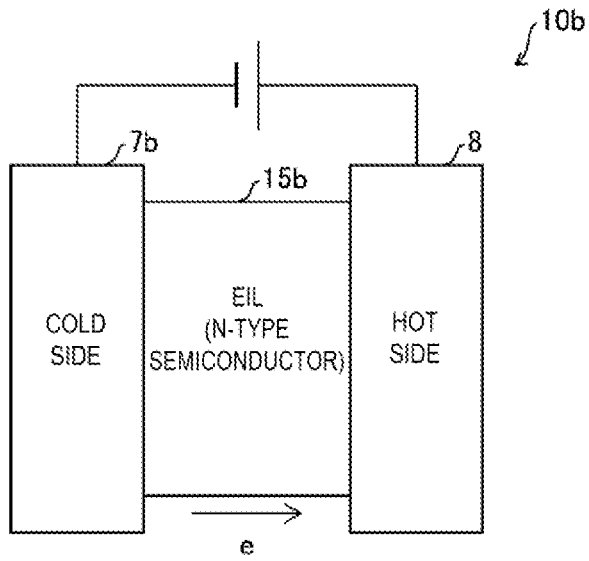
FIG. 8 is a diagram illustrating the first cooling element provided in the display device according to the second embodiment, at a time of being driven.

FIG. 8 is a diagram illustrating the first cooling element 10*b* provided in the display device 1*b*, at a time of being driven.

As illustrated in FIG. 8, when a voltage is applied between the extending portion 7*b* of the cathode and the heat radiating electrode 8 and electrons e are injected into the extending portion 15*b* of the electron injection layer (EIL), which is the n-type semiconductor, from the extending portion 7*b* of the cathode, the extending portion 15*b* of the electron injection layer serves as a material that exhibits the Peltier effect by which the cathode 7*a* and the extending portion 7*b* of the cathode are cooled and the heat radiating portion 7*b* of the cathode becomes the cold side, and the heat radiating electrode 8 is heated. Thus, the extending portion 7*b* of the cathode becomes the cold side, and the heat radiating electrode 8 becomes the hot side.

Figure 9:
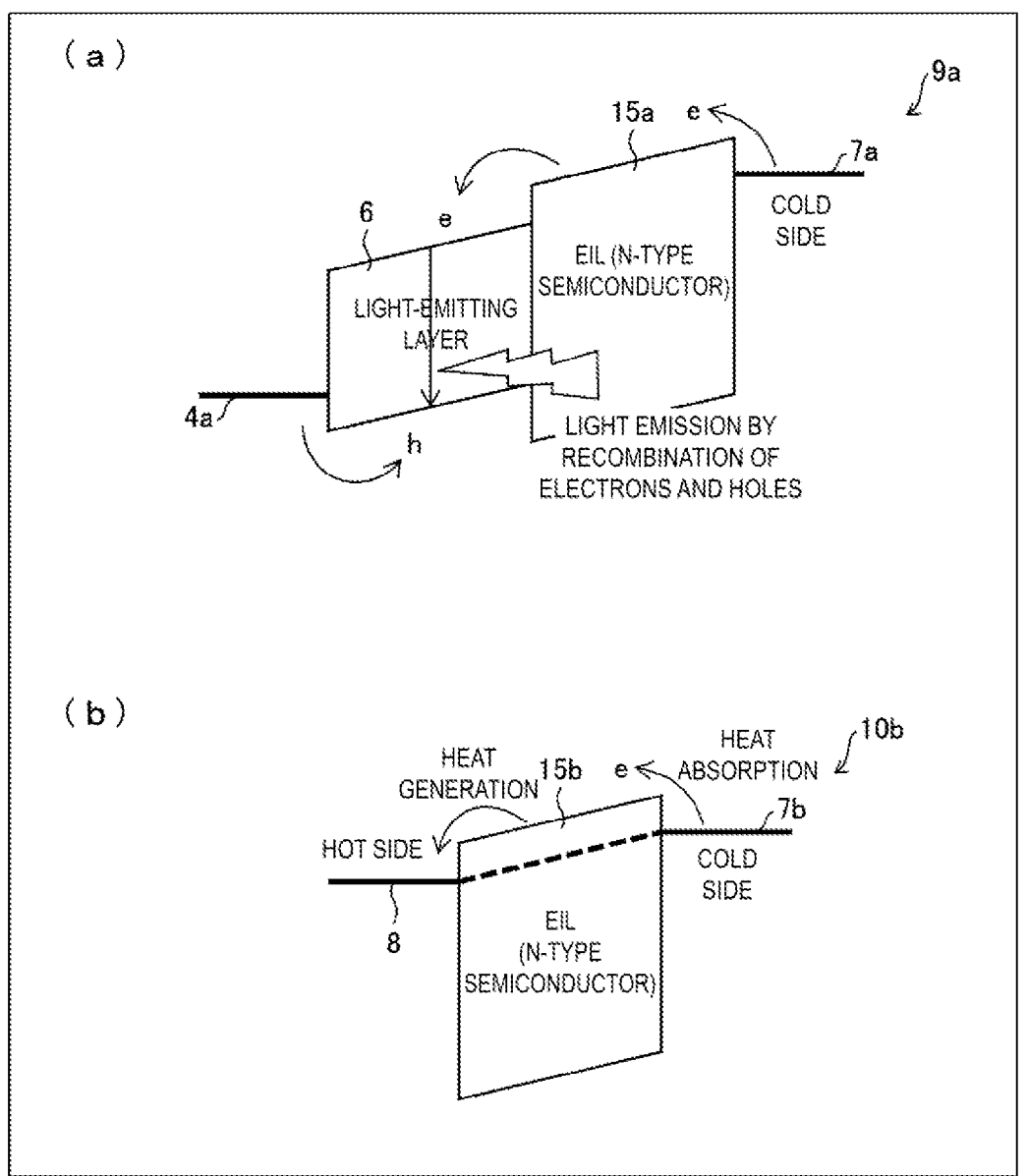
FIG. 9(*a*) is a band diagram of the light-emitting element provided in the display device according to the second embodiment, and FIG. 9(*b*) is a band diagram of the first cooling element provided in the display device according to the second embodiment.

(a) of FIG. 9 is a band diagram of the light-emitting element 9*a* provided in the display device 1*b*, and (b) of FIG. 9 is a band diagram of the first cooling element 10*b* provided in the display device 1*b*.

Note that the lower end of the band of the electron injection layer 15*a* illustrated in (a) of FIG. 9 is the valence band level of the electron injection layer 15*a*, and the upper end of the band of the electron injection layer 15*a* illustrated in (a) of FIG. 9 is the conduction band level thereof. Further, the lower end of the band of the light-emitting layer 6 illustrated in (a) of FIG. 9 is the valence band level of the light-emitting layer 6, and the upper end of the band of the light-emitting layer 6 illustrated in (a) of FIG. 9 is the conduction band level thereof. Further, the lower end of the band of the extending portion 15*b* of the electron injection layer illustrated in (b) of FIG. 9 is the valence band level of the extending portion 15*b* of the electron injection layer, and the upper end of the band of the extending portion 15*b* of the electron injection layer illustrated in (b) of FIG. 9 is the conduction band level thereof.

As illustrated in (a) of FIG. 9, when a voltage is applied between the anode 4*a* and the cathode 7*a* in order to cause the light-emitting element 9*a* to emit light, a portion of the energy is converted to heat in the light-emitting layer 6 and the electron injection layer 15*a*, and thus the temperature of the light-emitting element 9*a* including the light-emitting layer 6 is caused to increase. The display device 1*b* according to the present embodiment includes the first cooling element 10*b* that suppresses the temperature increase of the light-emitting element 9*a*. In the first cooling element 10*b*, as illustrated in (b) of FIG. 9, when the electrons e are injected into the extending portion 15*b* of the electron injection layer (EIL), which is the n-type semiconductor, from the extending portion 7*b* of the cathode, the extending portion 15*b* of the electron injection layer (EIL) absorbs heat of the extending portion 7*b* of the cathode and generates (radiates) heat to the heat radiating electrode 8 due to the Peltier effect. Therefore, the extending portion 7*b* of the cathode becomes the cold side, and the cathode 7*a* is also the cold side, thus, the heat generated in the light-emitting layer 6 and the electron injection layer 15*a* can be released via the cathode 7*a*, the extending portion 7*b* of the cathode, and the heat radiating electrode 8.

Further, as described above, in the present embodiment, the electron injection layer 15*a* provided in the light-emitting element 9*a* is formed to a film thickness from 10 nm to 100 nm such that the electron injection layer 15*a* is a layer thinner than the extending portion 15*b* of the electron injection layer having a film thickness from 1 μm to 100 μm. Thus, the heat generated in the light-emitting layer 6 diffuses very fast in the electron injection layer 15*a*.

Note that, from the perspective of including the electron injection layer 15*a*, which only absorbs a small amount of light in the visible light region emitted from the light-emitting layer 6, the band gap of the electron injection layer 15*a* (the difference between the lower end and the upper end of the band of the electron injection layer 15*a* illustrated in (a) of FIG. 9) is preferably 1.9 eV or greater.

Further, when the cathode 7*a* and the extending portion 7*b* of the cathode are formed of the single layer made of any one of Al, Ag, and ITO, or the layered body in which the plurality of single layers made of different materials are layered, in order to obtain the Peltier effect, the absolute value of the conduction band level of the electron injection layer 15*a* and the extending portion 15*b* of the electron injection layer (the upper end of the band of the extending portion 15*b* of the electron injection layer illustrated in (b) of FIG. 9) needs to be 4.8 eV or less.

Further, when the absolute value of the conduction band level of the electron injection layer 15*a* and the extending portion 15*b* of the electron injection layer is 4.8 eV or less, the work functions of the cathode 7*a* and the extending portion 7*b* of the cathode are preferably from 4.1 eV to 4.8 eV. Further, the work function of the heat radiating electrode 8 is preferably larger than the absolute value of the conduction band level of the electron injection layer 15*a* and the extending portion 15*b* of the electron injection layer (4.8 eV or less).

Figure 10:
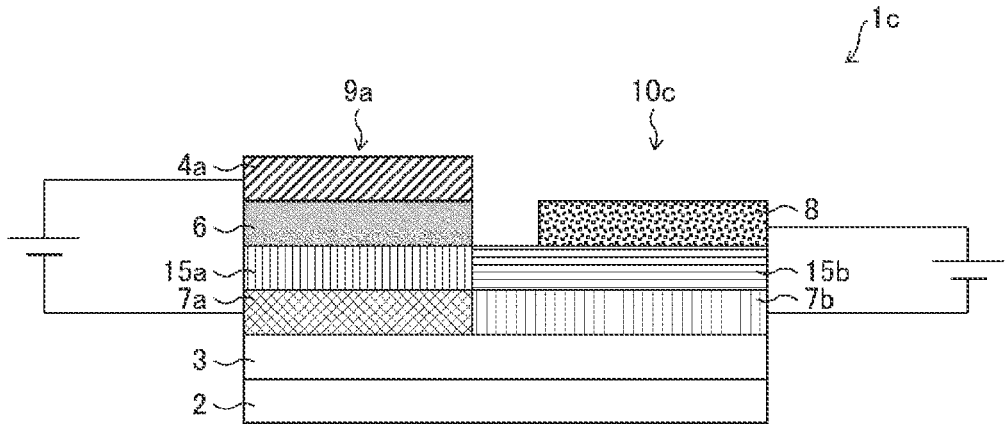
FIG. 10 is a cross-sectional view illustrating a schematic configuration of the light-emitting element and a first cooling element provided in a display device according to a modified example of the second embodiment.

FIG. 10 is a cross-sectional view illustrating a schematic configuration of the light-emitting element 9*a* and the first cooling element 10*c* provided in a display device 1*c* according to a modified example of the second embodiment.

As illustrated in FIG. 10, the display device 1*c* is different from the display device 1*b* illustrated in (a) of FIG. 7 described above in that, in the display device 1*c*, the film thickness of the electron injection layer 15*a* provided in the light-emitting element 9*a* is the same as the film thickness of the extending portion 15*b* of the electron injection layer provided in the first cooling element 10*c*. Compared with a case where the electron injection layer 15*a* and the extending portion 15*b* of the electron injection layer are formed to have different film thicknesses from each other, when the electron injection layer 15*a* and the extending portion 15*b* of the electron injection layer are formed to have the same film thickness, the electron injection layer 15*a* and the extending portion 15*b* of the electron injection layer can be formed in a shorter process.

Note that, in the display device 1*b*, 1*c*, for example, a driving period of the light-emitting element 9*a* may match with a driving period of the first cooling element 10*b*, 10*c*, or a pause period of the light-emitting element 9*a* may match with the driving period of the first cooling element 10*b*, 10*c*. However, the configuration is not limited to this example.

In the display device 1*b*, 1*c*, the first cooling element 10*b*, 10*c* can be driven as the Peltier element to cool the extending portion 7*b* of the cathode and also to cause the heat radiating electrode 8 to generate heat. Then, in the light-emitting element 9*a*, the light-emitting layer 6 and the electron injection layer 15*a* can be cooled by heat transfer via the cathode 7*a*, and thus degradation of the light-emitting layer 6 and the electron injection layer 15*a* due to heat, that is, degradation of the light-emitting element 9*a* due to heat can be efficiently suppressed. Further, in accordance with the calorific value of the light-emitting element 9*a*, the cooling amount of the first cooling element 10*b*, 10*c* can be appropriately adjusted.

Further, in the display device 1*b*, 1*c*, the first cooling element 10*b*, 10*c* includes the extending portion 7*b* of the cathode and the extending portion 15*b* of the electron injection layer, which are formed by extending the cathode 7*a* and the electron injection layer 15*a* provided in the light-emitting element 9*a*, respectively. Therefore, it is not necessary to prepare the first cooling element 10*b*, 10*c* and the light-emitting element 9*a* separately and assemble them together, and thus, a reduction in the manufacturing costs of the display device 1*b*, 1*c* and a reduction in the thickness of the display device 1*b*, 1*c* can be achieved.

Third Embodiment

Next, a third embodiment according to the disclosure will be described with reference to FIGS. 11 to 20. A display device 1*d*, 1*e*, 1*f*, 1*g* of the present embodiment is different from the first and second embodiments in that the display device 1d, 1e, 1f, 1g further includes a second cooling element 10e, 10f, 10g. Other configurations are as described in the first and second embodiments. For convenience of explanation, members having the same functions as the members illustrated in the diagrams in the first and second embodiments are denoted by the same reference numerals, and descriptions thereof will be omitted.

Figure 11:
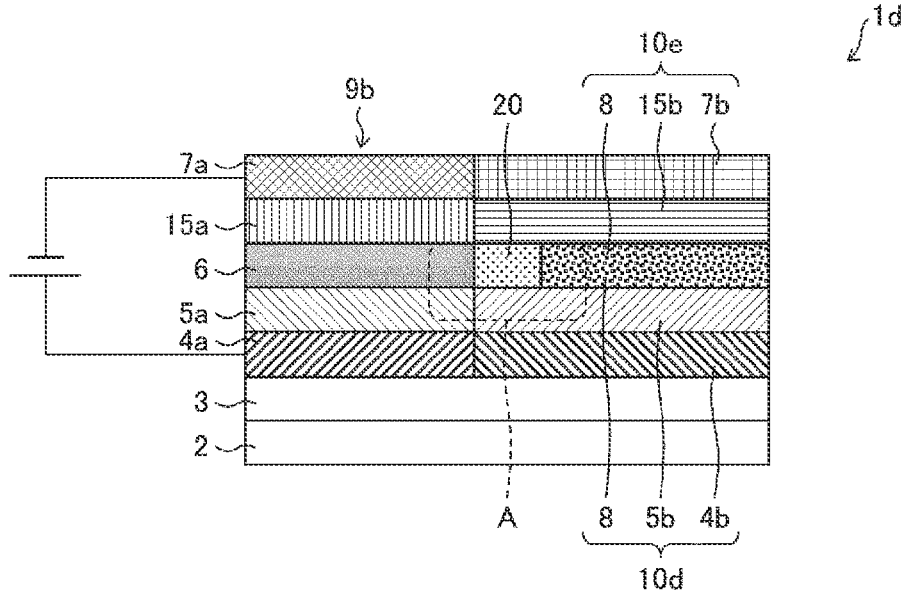
FIG. 11 is a cross-sectional view illustrating a schematic configuration of a light-emitting element, a first cooling element, and a second cooling element provided in a display device according to a third embodiment.

FIG. 11 is a cross-sectional view illustrating a schematic configuration of a light-emitting element 9b, a first cooling element 10d, and the second cooling element 10e provided in the display device 1d.

As illustrated in FIG. 11, the light-emitting element 9b provided on the TFT layer 3 includes the anode (second electrode) 4a, the cathode (first electrode) 7a, the light-emitting layer 6 provided between the anode 4a and the cathode 7a, the hole injection layer (first function layer) 5a provided between the light-emitting layer 6 and the anode 4a and being in contact with the anode 4a, and the electron injection layer (second function layer) 15a provided between the light-emitting layer 6 and the cathode 7a and being in contact with the cathode 7a.

The first cooling element 10d provided on the TFT layer 3 includes the heat radiating electrode (third electrode) 8, the extending portion 4b of the anode (second electrode) at least partially overlapping the heat radiating electrode 8, and the extending portion 5b of the hole injection layer (first function layer) overlapping the extending portion 4b of the anode and being in contact with the extending portion 4b of the anode and the heat radiating electrode 8.

The second cooling element 10e provided on the TFT layer 3 includes the heat radiating electrode (third electrode) 8, the extending portion 7b of the cathode (first electrode) at least partially overlapping the heat radiating electrode 8, and the extending portion 15b of the electron injection layer (second function layer) overlapping the extending portion 7b of the cathode and being in contact with the extending portion 7b of the cathode and the heat radiating electrode 8.

Note that, as will be illustrated in a modified example described below, for example, an opening may be provided in the extending portion 15b of the electron injection layer and the extending portion 7b of the cathode, both of which overlap the heat radiating electrode 8, such that a portion of the heat radiating electrode 8 is exposed to the air.

Further, in the display device 1d, although not illustrated, because the conductive member (the wiring line, for example) electrically connected to the heat radiating electrode 8 is exposed to the air in the frame region NDA illustrated in FIG. 1 and the first cooling element 10d and the second cooling element 10e serve as Peltier elements, the temperature of the heat radiating electrode 8 can be higher than the temperature of the cathode 7a and the temperature of the anode 4a by 0.1° C. or more.

Figure 12:
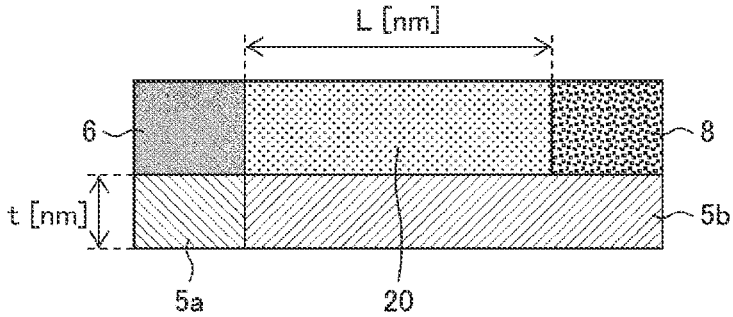
FIG. 12 is a partial enlarged view of a section A of the display device according to the third embodiment illustrated in FIG. 11.

FIG. 12 is a partial enlarged view of a section A of the display device 1d illustrated in FIG. 11.

As illustrated in FIGS. 11 and 12, the heat radiating electrode 8 is preferably formed separated from the light-emitting layer 6. With such a configuration, the heat radiating electrode 8 that radiates heat can be electrically and thermally isolated (insulated) from the light-emitting layer 6, which is an object to be cooled.

Further, as illustrated in FIG. 12, the heat radiating electrode 8 is preferably formed separated from the light-emitting layer 6 by a distance L (nm), which is greater than or equal to four times a thickness t (nm) of the hole injection layer (first function layer) 5a and less than or equal to 10000 times the thickness t (nm) of the hole injection layer (first function layer) 5a. Note that, also in the configuration according to each of the first and second embodiments described above, the heat radiating electrode 8 is preferably formed separated from the light-emitting layer 6 by the distance L (nm) described above. With such a configuration, the heat radiating electrode 8 that radiates heat can be electrically and thermally isolated (insulated) from the light-emitting layer 6, which is the object to be cooled. Further, the light-emitting element 9b can be disposed so as to satisfy at least a certain resolution.

Further, as illustrated in FIG. 12, it is preferable that a gap between the light-emitting layer 6 and the heat radiating electrode 8 is filled with an insulating material 20 containing at least one or more selected from the group consisting of silicon oxide ($SiO_2$, for example), magnesium oxide (MgO, for example), titanium oxide ($TiO_2$, for example), and zirconium oxide ($ZrO_2$, for example). Note that, also in the configuration of each of the first and second embodiments described above, the gap between the light-emitting layer 6 and the heat radiating electrode 8 may be filled with the insulating material 20. By using the metal oxide described above having high electrical insulating properties and high thermal insulating properties (low thermal conductivity) as the insulating material 20, the heat radiating electrode 8 that radiates heat can be electrically and thermally isolated (insulated) from the light-emitting layer 6, which is the object to be cooled, in a more reliable manner.

Figure 13:
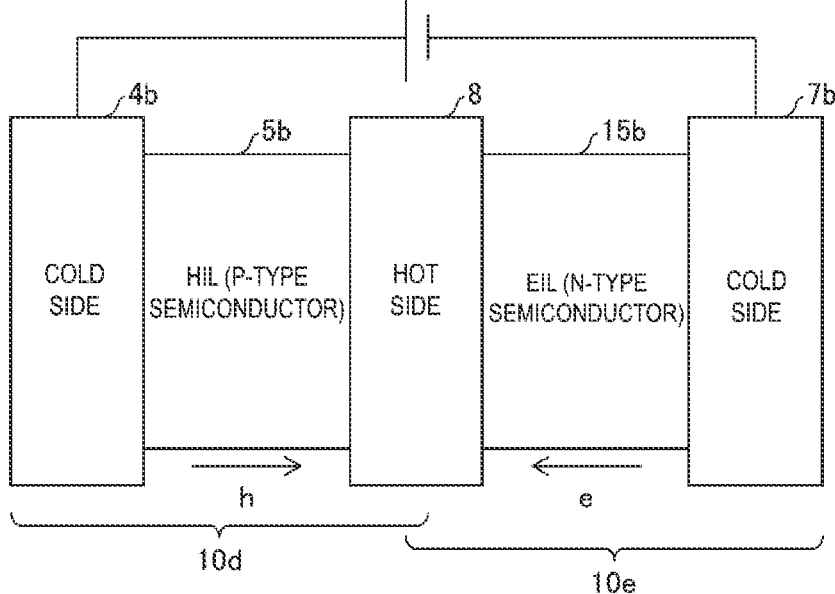
FIG. 13 is a diagram illustrating the first cooling element and the second cooling element provided in the display device according to the third embodiment, at a time of being driven.

FIG. 13 is a diagram illustrating the first cooling element 10d and the second cooling element 10e provided in the display device 1d, at a time of being driven. Note that, in the first cooling element 10d and the second cooling element 10e, the heat radiating electrode 8 is a common electrode for applying a voltage to the extending portion 5b of the hole injection layer and the extending portion 15b of the electron injection layer independently of the light-emitting element 9b.

As illustrated in FIG. 13, when a voltage is applied between the extending portion 4b of the anode and the extending portion 7b of the cathode and the holes h are injected into the extending portion 5b of the hole injection layer (HIL), which is a p-type semiconductor, from the extending portion 4b of the anode, the extending portion 5b of the hole injection layer serves as a material exhibiting the Peltier effect by which the anode 4a and the extending portion 4b of the anode are cooled and the heat radiating electrode 8 is heated. Thus, the extending portion 4b of the anode becomes the cold side, and the heat radiating electrode 8 becomes the hot side.

Further, as illustrated in FIG. 13, when a voltage is applied between the extending portion 4b of the anode and the extending portion 7b of the cathode and the electrons e are injected into the extending portion 15b of the electron injection layer (EIL), which is an n-type semiconductor, from the extending portion 7b of the cathode, the extending portion 15b of the electron injection layer serves as a material that exhibits the Peltier effect by which the cathode 7a and the extending portion 7b of the cathode are cooled and the heat radiating electrode 8 is heated. Thus, the extending portion 7b of the cathode becomes the cold side, and the heat radiating electrode 8 becomes the hot side.

Figure 14:
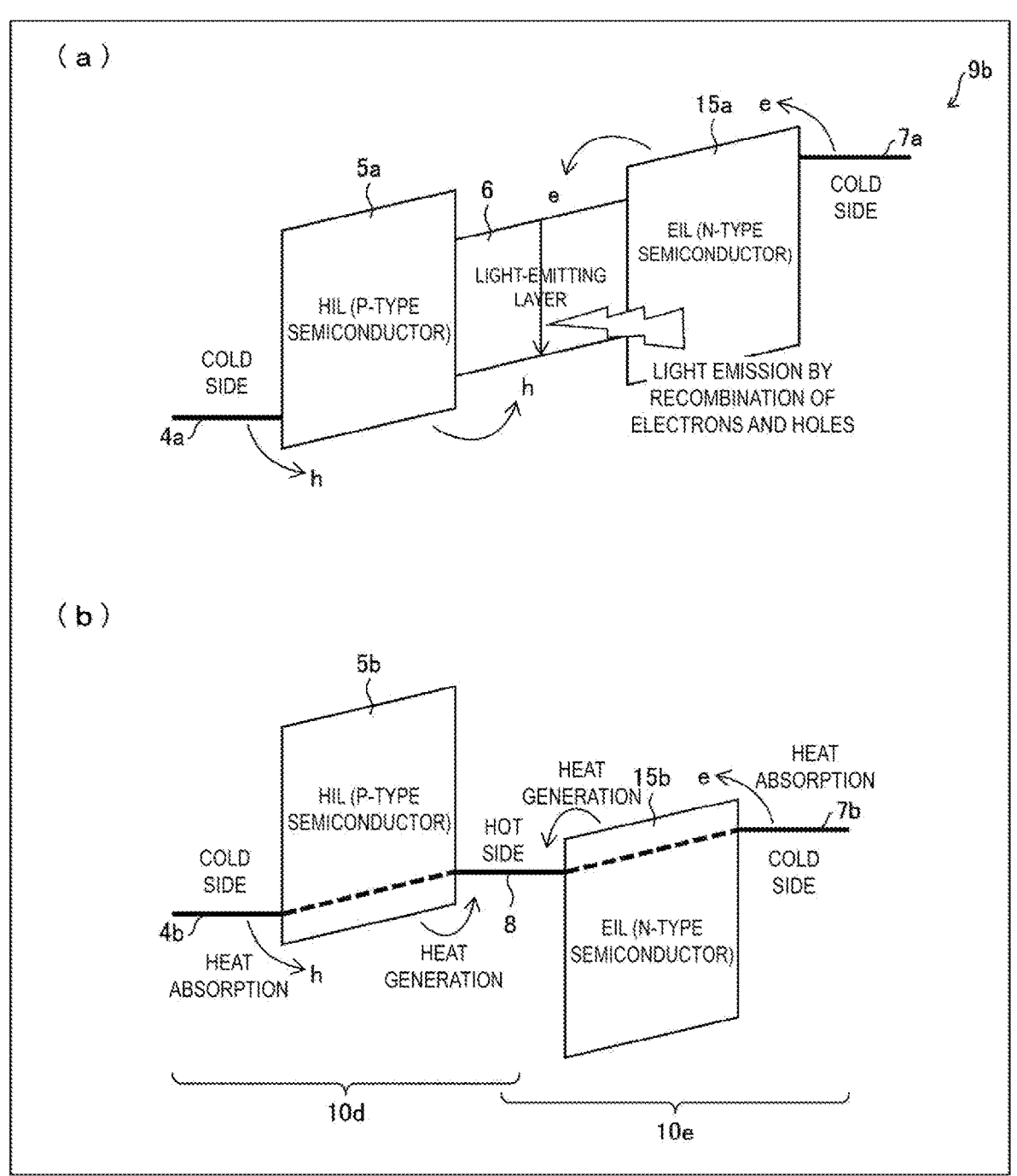
FIG. 14(*a*) is a band diagram of the light-emitting element provided in the display device according to the third embodiment, and FIG. 14(*b*) is a band diagram of the first cooling element and the second cooling element provided in the display device according to the third embodiment.

(a) of FIG. 14 is a band diagram of the light-emitting element 9b provided in the display device 1d, and (b) of FIG. 14 is a band diagram of the first cooling element 10d and the second cooling element 10e provided in the display device 1d.

As illustrated in (a) of FIG. 14, when a voltage is applied between the anode 4a and the cathode 7a in order to cause the light-emitting element 9b to emit light, a portion of the energy is converted to heat in the light-emitting layer 6, the hole injection layer 5a, and the electron injection layer 15a, and thus the temperature of the light-emitting element 9b including the light-emitting layer 6 is caused to increase. The display device 1d of the present embodiment includes the first cooling element 10d and the second cooling element 10e that suppress the temperature increase of the light-emitting element 9b. As illustrated in (b) of FIG. 14, in the first cooling element 10d, when the holes h are injected into the extending portion 5b of the hole injection layer (HIL), which is a p-type semiconductor, from the extending portion 4b of the anode, the extending portion 5b of the hole injection layer (HIL) absorbs heat of the extending portion 4b of the anode and generates (radiates) heat to the heat radiating electrode 8 due to the Peltier effect. Therefore, the extending portion 4b of the anode becomes the cold side and the anode 4a is also the cold side; thus, the heat generated in the light-emitting layer 6, the hole injection layer 5a, and the electron injection layer 15a can be released via the anode 4a, the extending portion 4b of the anode, and the heat radiating electrode 8. Further, as illustrated in (b) of FIG. 14, in the second cooling element 10e, when the electrons e are injected into the extending portion 15b of the electron injection layer (EIL), which is the n-type semiconductor, from the extending portion 7b of the cathode, the extending portion 15b of the electron injection layer (EIL) absorbs heat of the extending portion 7b of the cathode and generates (radiates) heat to the heat radiating electrode 8 due to the Peltier effect. Therefore, the extending portion 7b of the cathode becomes the cold side and the cathode 7a is also the cold side; thus, the heat generated in the light-emitting layer 6, the hole injection layer 5a, and the electron injection layer 15a can be released via the cathode 7a, the extending portion 7b of the cathode, and the heat radiating electrode 8.

Further, in the present embodiment, the film thickness of the hole injection layer 5a is the same as the film thickness of the extending portion 5b of the hole injection layer, and the film thickness of the electron injection layer 15a is the same as the film thickness of the extending portion 15b of the electron injection layer. However, the configuration is not limited to this example.

Note that, for example, when the absolute value of the conduction band level of the electron injection layer 15a and the extending portion 15b of the electron injection layer is 4.8 eV, and the absolute value of the valence band level of the hole injection layer 5a and the extending portion 5b of the hole injection layer is 4.5 eV, the work functions of the anode 4a, the cathode 7a, and the heat radiating electrode 8 are preferably from 4.5 eV to 4.8 eV.

Figure 15:
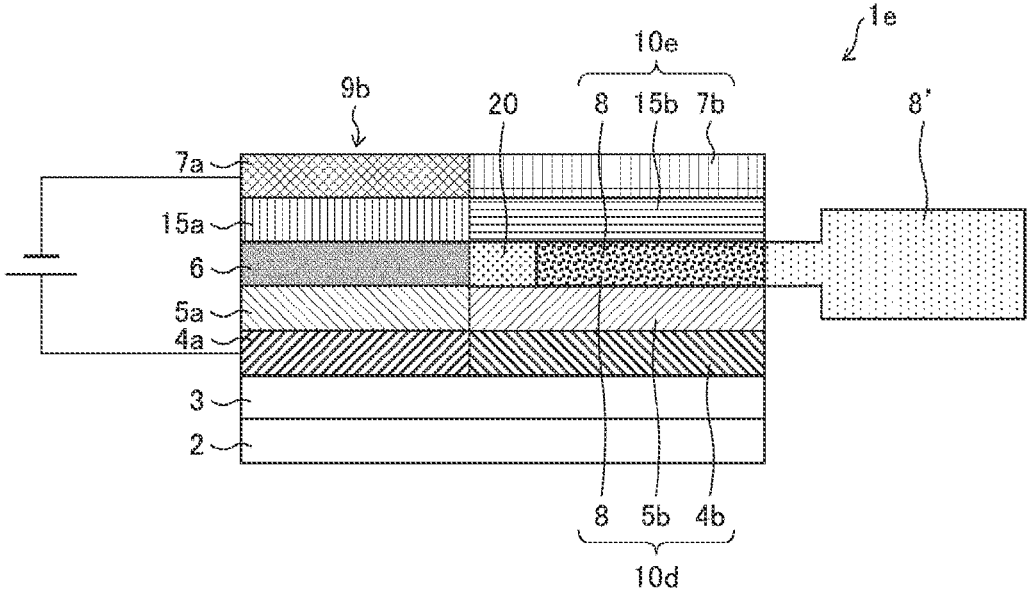
FIG. 15 is a cross-sectional view illustrating a schematic configuration of a light-emitting element, a first cooling element, and a second cooling element provided in a display device according to a first modified example of the third embodiment.

FIG. 15 is a cross-sectional view illustrating a schematic configuration of the light-emitting element 9b, the first cooling element 10d, and the second cooling element 10e provided in the display device 1e according to a first modified example of the third embodiment.

The display device 1e illustrated in FIG. 15 is different from the display device 1d illustrated in FIG. 11 in which the conductive member (the wiring line, for example) electrically connected to the heat radiating electrode 8 is exposed to the air in the frame region NDA illustrated in FIG. 1, in that a conductive member 8' electrically connected to the heat radiating electrode 8 is exposed to the air in the display region DA illustrated in FIG. 1. Note that, in the present embodiment, the conductive member 8' and the heat radiating electrode 8 are formed of the same material, but the configuration is not limited to this example.

Further, in the display device 1e, because the conductive member 8' electrically connected to the heat radiating electrode 8 is exposed to the air and the first cooling element 10d and the second cooling element 10e serve as Peltier elements, the temperature of the heat radiating electrode 8 can be higher than the temperature of the cathode 7a and the temperature of the anode 4a by 0.1° C. or more.

Figure 16:
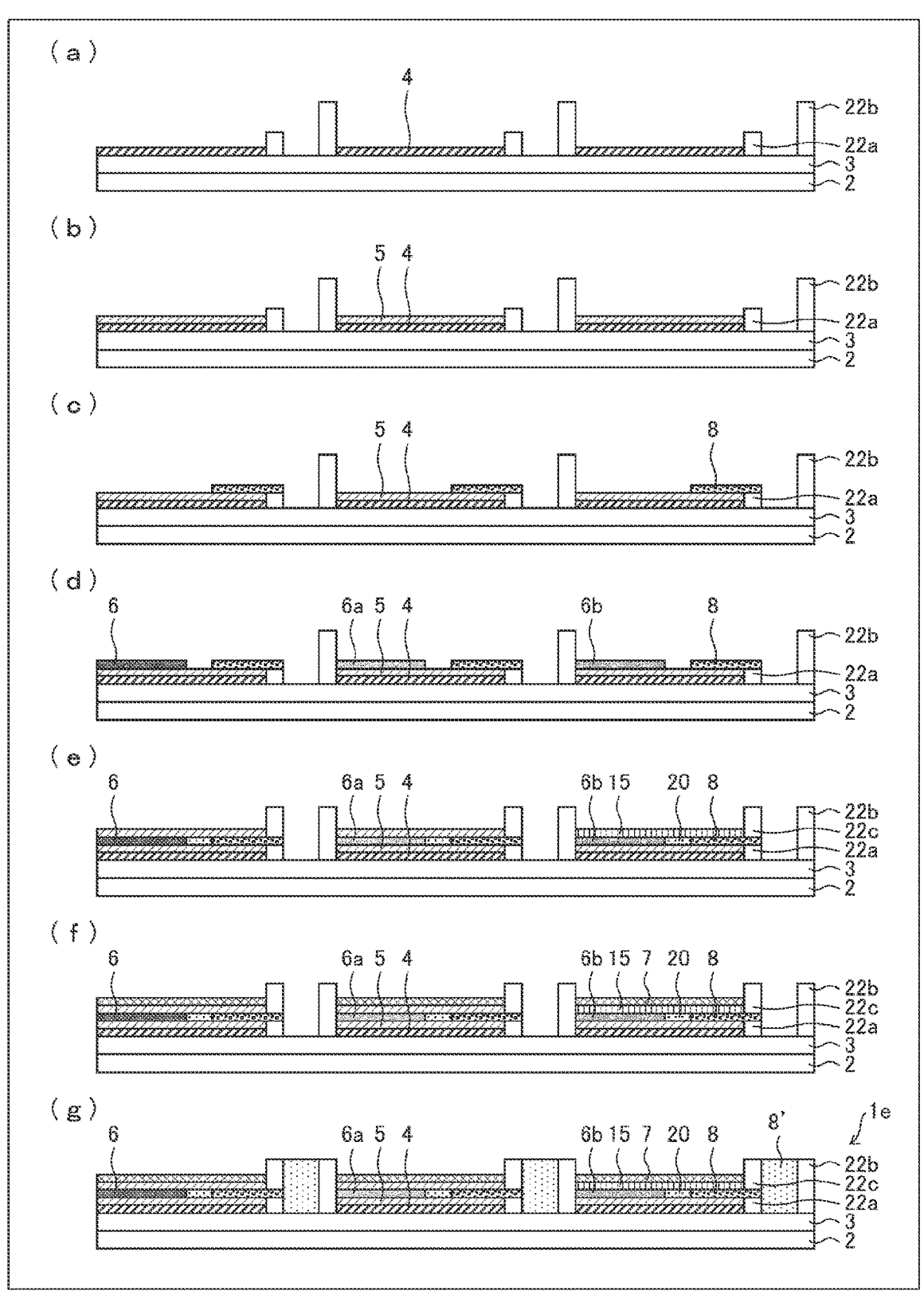
FIGS. 16(*a*), 16(*b*), 16(*c*), 16(*d*), 16(*e*), 16(*f*), and 16(*g*) are diagrams each illustrating a part of a manufacturing process of the display device according to the first modified example of the third embodiment.

(a) to (g) of FIG. 16 are diagrams each illustrating a part of a manufacturing process of the display device 1e according to the first modified example of the third embodiment.

Figure 17:
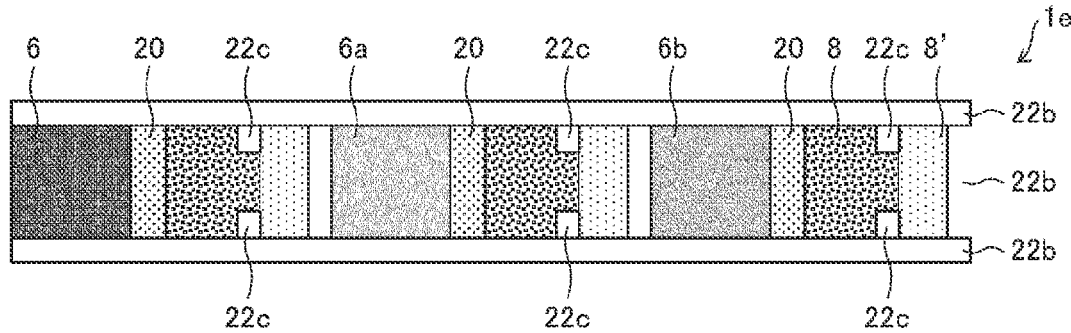
FIG. 17 is a plan view of the display device according to the first modified example of the third embodiment.

FIG. 17 is a plan view of the display device 1e according to the first modified example of the third embodiment. Note that, in FIG. 17, an electron injection layer formation layer 15 and a cathode formation layer 7 are not illustrated.

As illustrated in (a) of FIG. 16, first, after forming a film made of a material constituting the anode 4a and the extending portion 4b of the anode on the TFT layer 3 provided on the substrate 2, the film was patterned to form an anode formation layer 4 forming the anode 4a and the extending portion 4b of the anode. After that, for example, by applying, exposing, and developing a photosensitive resin, a first bank 22a having a lower height and a second bank 22b having a higher height were formed. Note that the first bank 22a and the second bank 22b are layers covering the edge of the anode formation layer 4. Then, as illustrated in (b) of FIG. 16, a hole injection layer formation layer 5 forming the hole injection layer 5a and the extending portion 5b of the hole injection layer can be formed, for example, by an ink-jet method. Thereafter, as illustrated in (c) of FIG. 16, after forming a film made of a material constituting the heat radiating electrode 8, the film was patterned to form the heat radiating electrode 8. Note that the heat radiating electrode 8 is formed so as to overlap the first bank 22a and a portion of the hole injection layer formation layer 5. After that, as illustrated in (d) of FIG. 16, the light-emitting layer 6, which is a red light-emitting layer, a light-emitting layer 6a, which is a green light-emitting layer, and a light-emitting layer 6b, which is a blue light-emitting layer, were sequentially formed on the hole injection layer formation layer 5 in separate processes such that they were separated from the heat radiating electrode 8 by a predetermined distance. Note that the heat radiating electrode 8 illustrated in (c) of FIG. 16 may be formed after forming each of the light-emitting layers illustrated in (d) of FIG. 16. Then, as illustrated in (e) of FIG. 16, after filling a gap between the light-emitting layer 6, 6a, 6b and the heat radiating electrode 8 with the insulating material 20, a third bank 22c was formed on the heat radiating electrode 8 so as to overlap the first bank 22a, for example, by applying, exposing, and developing a photosensitive resin. After that, the electron injection layer formation layer 15 forming the electron injection layer 15a and the extending portion 15b of the electron injection layer can be formed, for example, by an ink-jet method. Thereafter, as illustrated in (f) of FIG. 16, after forming a film made of a material constituting the cathode 7a and the extending portion 7b of the cathode on the electron injection layer formation layer 15, the film was patterned to form the cathode formation layer 7 forming the cathode 7a and the extending portion 7b of the cathode. After that, as illustrated in (g) of FIG. 16 and FIG. 17, by forming the conductive member 8' in a region between the second bank 22b and the third bank 22c such that the conductive member 8' is electrically connected to the heat radiating electrode 8, the display device 1e can be manufactured.

As illustrated in (g) of FIG. 16 and FIG. 17, the heat radiating electrode 8 that is in contact with the electron injection layer formation layer 15 and the hole injection layer formation layer 5 is continuous up to the conductive member 8'. Then, due to the high thermal conductivity of the heat radiating electrode 8, the temperature of the heat radiating electrode 8 and the temperature of the conductive member 8' are kept substantially identical to each other, and the heat generated by the heat radiating electrode 8 due to the Peltier effect is released into the air due to thermal convection at a portion of the conductive member 8' that is exposed to the air.

Although, in the present embodiment, a description is made using an example in which the heat radiating electrode 8 and the conductive member 8' are provided in all of the subpixels, the configuration is not limited to this example. For example, in the case of the green subpixel including the light-emitting layer 6a, which is the green light-emitting layer, since it has good visibility, the drive current can be reduced and the calorific value is relatively low compared with the red subpixel including the light-emitting layer 6, which is the red light-emitting layer, and the blue subpixel including the light-emitting layer 6b, which is the blue light-emitting layer. Thus, the green subpixel may have a configuration in which the heat radiating electrode 8 and the conductive member 8' are not provided and no cooling element is provided.

Figure 18:
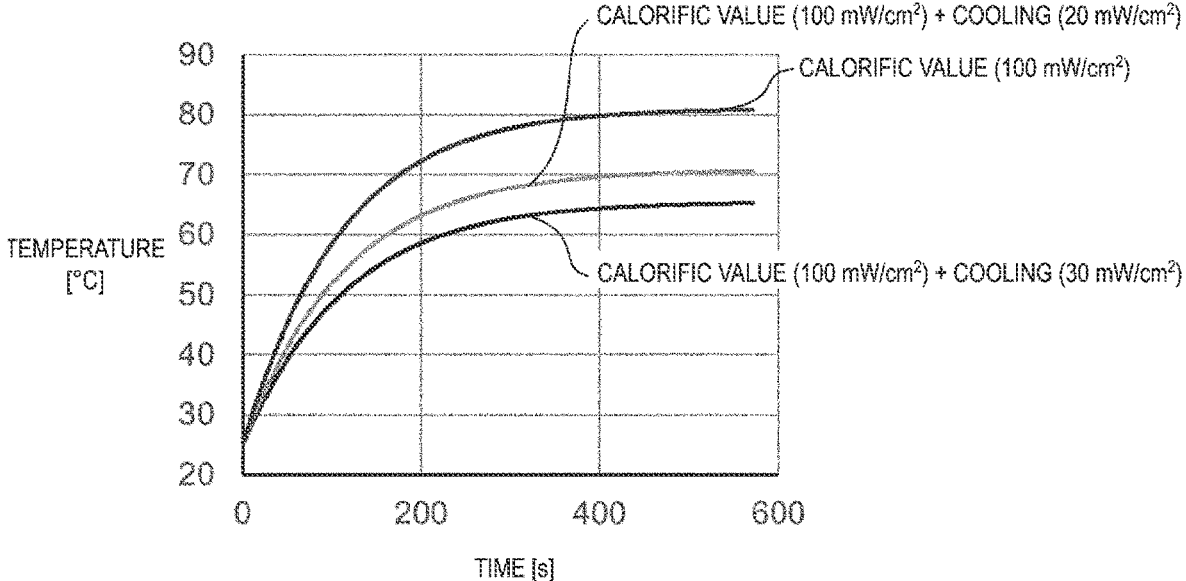
FIG. 18 is a diagram showing calculation results of the temperature changes in the model element when there is no cooling effect, when the cooling effect is 20 mW/cm$^2$, and when the cooling effect is 30 mW/cm$^2$, in a case where a calorific value of 100 mW/cm$^2$ is generated in the model element illustrated in (a) of FIG. 5.

FIG. 18 is a diagram showing calculation results of the temperature changes in the model element when there is no cooling effect, when the cooling effect is 20 mW/cm², and when the cooling effect is 30 mW/cm², in a case where a calorific value of 100 mW/cm² is generated in the model element illustrated in (a) of FIG. 5.

As shown in FIG. 18, compared with the case where there is no cooling effect, when the cooling effect is 20 mW/cm², the temperature which the model element reaches after a predetermined time period can be significantly reduced. Then, when the cooling effect is 30 mW/cm², the temperature which the model element reaches after a predetermined time period can be even more significantly reduced.

In the display device 1d illustrated in FIG. 11 and the display device 1e illustrated in FIG. 15, in addition to the first cooling element 10d, the second cooling element 10e can also cool the light-emitting element 9b. Thus, the cooling effect is large, so the temperature which the light-emitting element 9b reaches after a predetermined time period can be significantly reduced. Note that, in such a case, the temperature of the heat radiating electrode 8 changes depending on the area of the electrode, the emissivity of the electrode material, and the thermal convection of the atmosphere, and can be higher than the temperature of the anode 4a, the temperature of the extending portion 4b of the anode, the temperature of the cathode 7a, and the temperature of the extending portion 7b of the cathode by 0.1° C. or more.

In the display device 1d, 1e, in addition to the first cooling element 10d, the second cooling element 10e is provided. The second cooling element 10e can be driven as the Peltier element to cool the extending portion 7b of the cathode and also to cause the heat radiating electrode 8 to generate heat. Then, in the light-emitting element 9b, the light-emitting layer 6, the hole injection layer 5a, and the electron injection layer 15a can be cooled by heat transfer via the cathode 7a and the anode 4a, and thus degradation of the light-emitting layer 6, the hole injection layer 5a, and the electron injection layer 15a, that is, degradation of the light-emitting element 9b due to heat can be efficiently suppressed.

Further, in the display device 1d, 1e, the first cooling element 10d and the second cooling element 10e include the extending portion 7b of the cathode, the extending portion 4b of the anode, the extending portion 5b of the hole injection layer, and the extending portion 15b of the electron injection layer, which are formed by extending the cathode 7a, the anode 4a, the hole injection layer 5a, and the electron injection layer 15a provided in the light-emitting element 9b, respectively. Therefore, it is not necessary to prepare the first cooling element 10d and the second cooling element 10e separately from the light-emitting element 9b and assemble them together, and thus, a reduction in the manufacturing costs of the display device 1d, 1e and a reduction in the thickness of the display device 1d, 1e can be achieved.

Further, in the display device 1d, 1e, the voltage applied between the cathode 7a and the anode 4a to drive the light-emitting element 9b is applied between the extending portion 7b of the cathode and the extending portion 4b of the anode as it is, and the first cooling element 10d and the second cooling element 10e can be driven by the voltage. Thus, the number of power sources required can be reduced.

Figure 19:
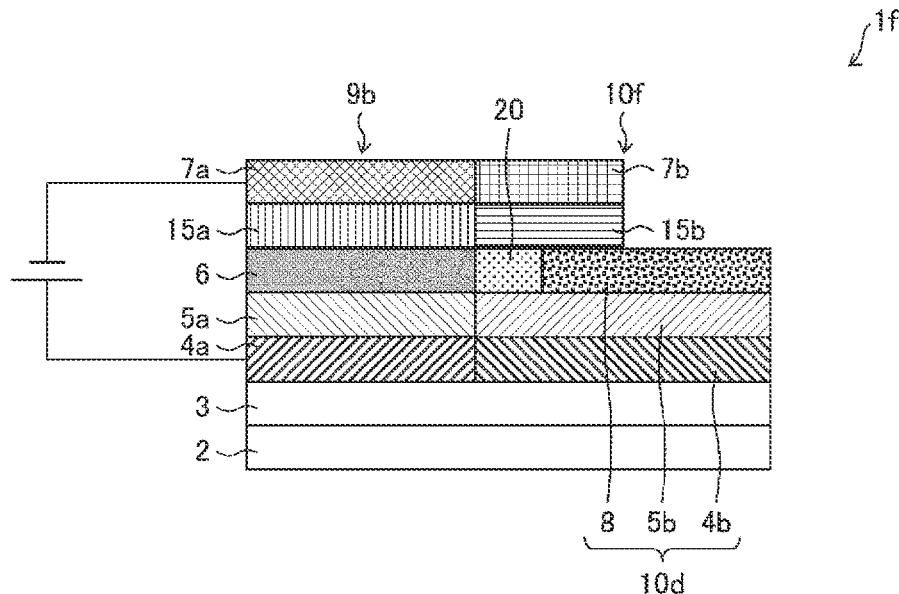
FIG. 19 is a cross-sectional view illustrating a schematic configuration of a light-emitting element, a first cooling element, and a second cooling element provided in a display device according to a second modified example of the third embodiment.

FIG. 19 is a cross-sectional view illustrating a schematic configuration of the light-emitting element 9b, the first cooling element 10d, and a second cooling element 10f provided in a display device 1f according to a second modified example of the third embodiment.

As illustrated in FIG. 19, in the display device 1f, an opening is provided in the extending portion 15b of the electron injection layer and the extending portion 7b of the cathode, both of which overlap the heat radiating electrode 8, such that a portion of the heat radiating electrode 8 is exposed to the air.

Figure 20:
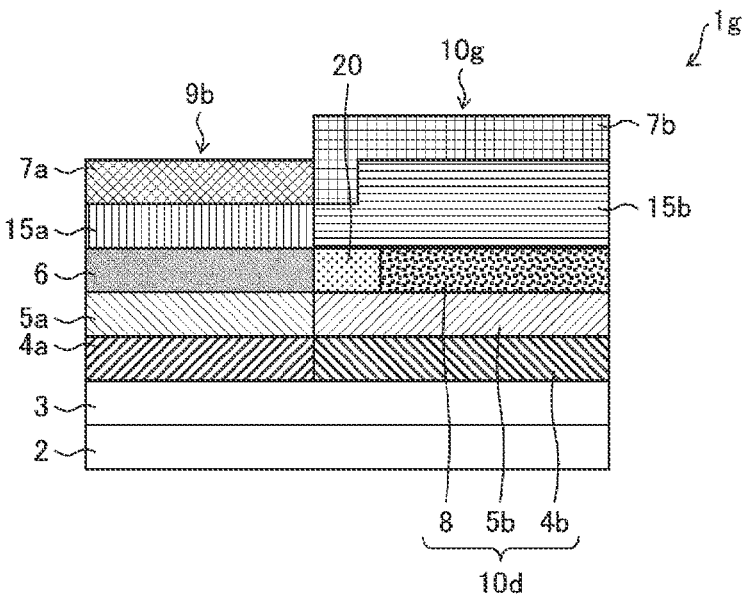
FIG. 20 is a cross-sectional view illustrating a schematic configuration of a light-emitting element, a first cooling element, and a second cooling element provided in a display device according to a third modified example of the third embodiment.

FIG. 20 is a cross-sectional view illustrating a schematic configuration of the light-emitting element 9b, the first cooling element 10d, and a second cooling element 10g provided in a display device 1g according to a third modified example of the third embodiment.

As illustrated in FIG. 20, in the display device 1g, the voltage applied between the cathode 7a and the anode 4a to drive the light-emitting element 9b is applied between the extending portion 7b of the cathode and the extending portion 4b of the anode as it is, and the first cooling element 10d and the second cooling element 10g are driven by the voltage. Thus, a ratio between the value of current flowing through the light-emitting layer 6 and the value of current flowing through the heat radiating electrode 8 needs to be determined in advance at a time of manufacturing the display device 1g, on the basis of the film thickness of the extending portion 15b of the electron injection layer and the film thickness of the extending portion 5b of the hole injection layer. Therefore, in the display device 1g, the extending portion 15b of the electron injection layer is formed to have a larger film thickness than the extending portion 5b of the hole injection layer, but the configuration is not limited to this example.

Fourth Embodiment

Next, a fourth embodiment of the disclosure will be described with reference to FIG. 21. A display device 1h according to the present embodiment is different from the third embodiment in that the display device 1h is provided with a first cooling element 10h and a second cooling element 10i that can be individually controlled. Other configurations are as described in the third embodiment. For convenience of explanation, members having the same functions as those of the members illustrated in the drawings in the third embodiment are denoted by the same reference numerals, and descriptions thereof will be omitted.

Figure 21:
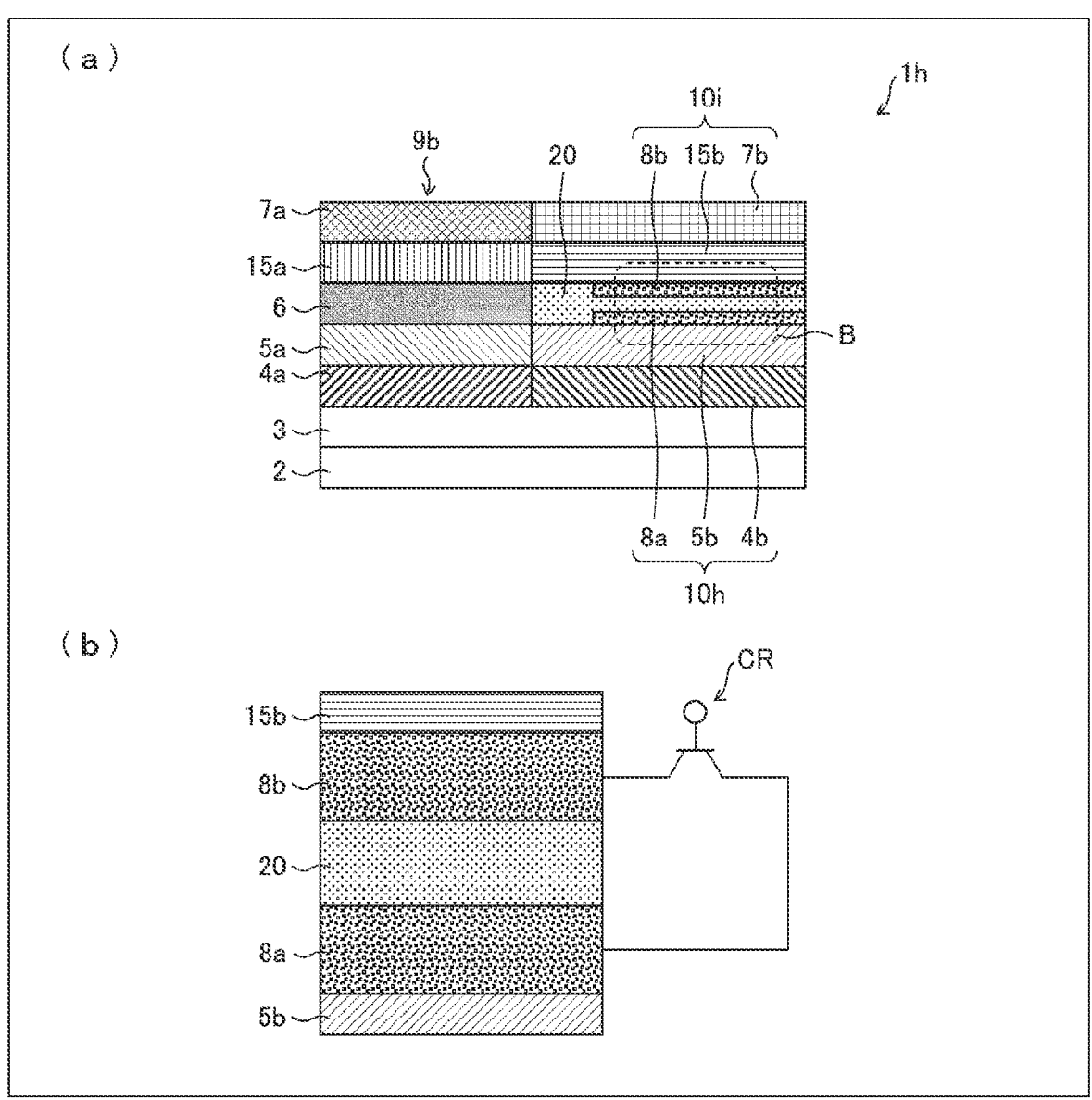
FIG. 21(*a*) is a cross-sectional view illustrating a schematic configuration of a light-emitting element, a first cooling element, and a second cooling element provided in a display device according to a fourth embodiment, and FIG. 21(*b*) is a partial enlarged view of a section B of the display device according to the fourth embodiment illustrated in FIG. 21(*a*).

(a) of FIG. 21 is a cross-sectional view illustrating a schematic configuration of the light-emitting element 9b, the first cooling element 10*h*, and the second cooling element 10*i* provided in the display device 1*h*, and (b) of FIG. 21 is a partial enlarged view of a section B of the display device 1*h* illustrated in (a) of FIG. 21.

As illustrated in (a) of FIG. 21, the first cooling element 10*h* includes the extending portion 4*b* of the anode, a heat radiating electrode 8*a* for the first cooling element (an electrode for the first cooling element), and the extending portion 5*b* of the hole injection layer that is in contact with the extending portion 4*b* of the anode and the heat radiating electrode 8*a* for the first cooling element. The second cooling element 10*i* includes the extending portion 7*b* of the cathode, a heat radiating electrode 8*b* for the second cooling element (an electrode for the second cooling element), and the extending portion 15*b* of the electron injection layer that is in contact with the extending portion 7*b* of the cathode and the heat radiating electrode 8*b* for the second cooling element. Then, the heat radiating electrode 8*a* for the first cooling element and the heat radiating electrode 8*b* for the second cooling element are electrically and thermally isolated (insulated) from each other by the insulating material 20.

Further, as illustrated in (b) of FIG. 21, the display device 1*h* further includes a current controller CR that controls the current flowing through each of the heat radiating electrode 8*a* for the first cooling element and the heat radiating electrode 8*b* for the second cooling element.

Thus, the first cooling element 10*h* and the second cooling element 10*i* provided in the display device 1*h* can be individually controlled. Further, in accordance with the calorific value of the light-emitting element 9*b*, the cooling amounts of the first cooling element 10*h* and the second cooling element 10*i* can be appropriately adjusted.

Fifth Embodiment

Next, a fifth embodiment of the disclosure will be described with reference to FIG. 22. A display device 1*i* according to the present embodiment is different from the first embodiment in that the display device 1*i* is provided with a light-emitting element 9*c* including a hole transport layer 25*a* and an electron transport layer 26*a*, and also in that the heat radiating electrode 8 is not exposed and the conductive member 8' electrically connected to the heat radiating electrode 8 is exposed to the air. Other configurations are as described in the first embodiment. For convenience of explanation, components having the same functions as those described in diagrams of the first embodiment are denoted by the same reference numerals, and descriptions thereof will be omitted.

Figure 22:
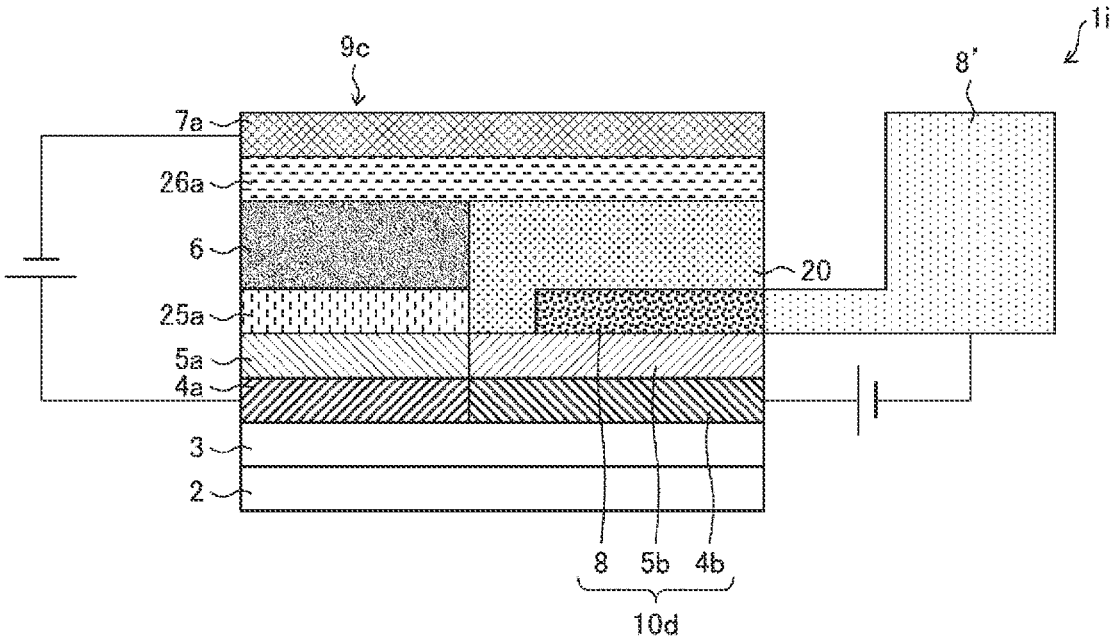
FIG. 22 is a cross-sectional view illustrating a schematic configuration of a light-emitting element and a first cooling element provided in a display device according to a fifth embodiment.

FIG. 22 is a cross-sectional view illustrating a schematic configuration of the light-emitting element 9*c* and the first cooling element 10*d* provided in the display device 1*i*.

As illustrated in FIG. 22, the light-emitting element 9*c* includes the hole transport layer 25*a* and the electron transport layer 26*a*. Further, although the heat radiating electrode 8 provided in the first cooling element 10*d* is covered by the insulating material 20, the electron transport layer 26*a*, and the cathode 7*a* and is not exposed, the conductive member 8' electrically connected to the heat radiating electrode 8 is exposed to the air.

In the display device 1*i*, even when the light-emitting element 9*c* includes the hole transport layer 25*a* and the electron transport layer 26*a*, degradation of the light-emitting element 9*c* due to heat can be efficiently suppressed by the first cooling element 10*d*.

The display device 1*i* is provided with two different power sources, namely, a first power source for the light-emitting element 9*c* and a second power source for the first cooling element 10*d*. Here, a description is made using an example in which, using those power sources, heat generated at a time of driving the light-emitting element 9*c* is eliminated by driving the first cooling element 10*d* while the light-emitting element 9*c* is stopped, but the configuration is not limited to this example.

Sixth Embodiment

Next, a sixth embodiment of the disclosure will be described with reference to FIG. 23. A display device 1*j* according to the present embodiment is different from the first embodiment in that the display device 1*j* is provided with a light-emitting element 9*d* including the hole transport layer 25*a*, the electron transport layer 26*a*, and the electron injection layer 15*a*, and also in that the heat radiating electrode 8 is not exposed and the conductive member 8' electrically connected to the heat radiating electrode 8 is exposed to the air. Other configurations are as described in the first embodiment. For convenience of explanation, components having the same functions as those described in diagrams of the first embodiment are denoted by the same reference numerals, and descriptions thereof will be omitted.

Figure 23:
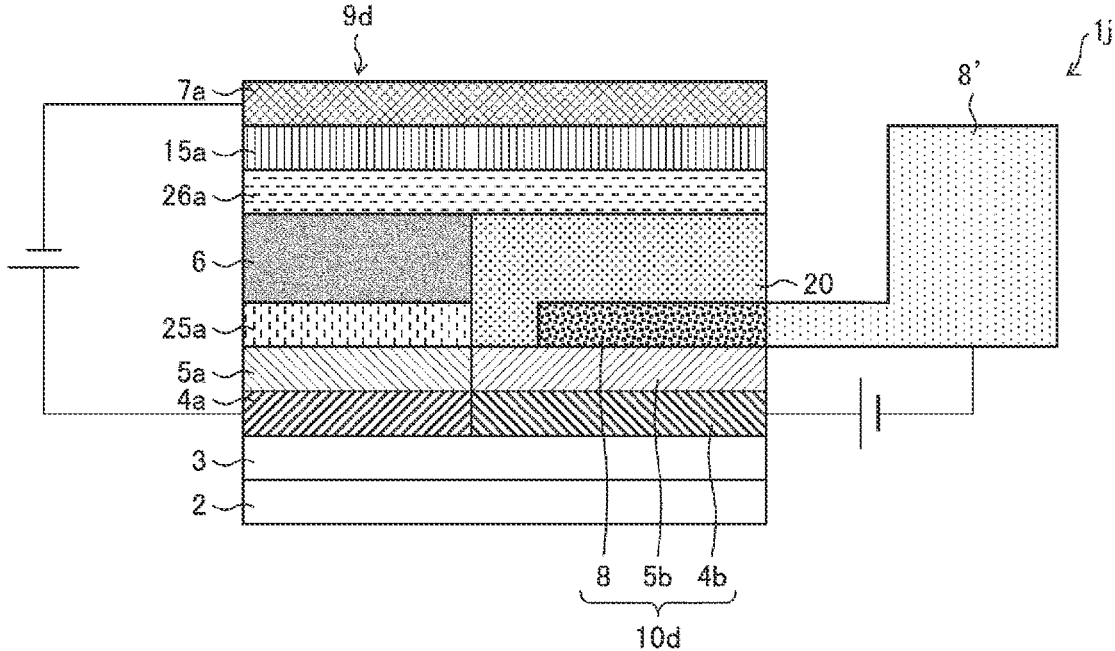
FIG. 23 is a cross-sectional view illustrating a schematic configuration of a light-emitting element and a first cooling element provided in a display device according to a sixth embodiment.

FIG. 23 is a cross-sectional view illustrating a schematic configuration of the light-emitting element 9*d* and the first cooling element 10*d* provided in the display device 1*j*.

As illustrated in FIG. 23, the light-emitting element 9*d* includes the hole transport layer 25*a*, the electron transport layer 26*a*, and the electron injection layer 15*a*. Further, although the heat radiating electrode 8 provided in the first cooling element 10*d* is covered by the insulating material 20, the electron transport layer 26*a*, the electron injection layer 15*a*, and the cathode 7*a* and is not exposed, the conductive member 8' electrically connected to the heat radiating electrode 8 is exposed to the air.

In the display device 1*j*, even when the light-emitting element 9*d* includes the hole transport layer 25*a*, the electron transport layer 26*a*, and the electron injection layer 15*a*, degradation of the light-emitting element 9*d* due to heat can be efficiently suppressed by the first cooling element 10*d*.

The display device 1*j* is provided with two different power sources, namely, a first power source for the light-emitting element 9*d* and a second power source for the first cooling element 10*d*. Here, a description is made using an example in which, using those power sources, heat generated at a time of driving the light-emitting element 9*d* is eliminated by driving the first cooling element 10*d* while the light-emitting element 9*d* is stopped, but the configuration is not limited to this example.

Seventh Embodiment

Next, a seventh embodiment of the disclosure will be described with reference to FIG. 24. A display device 1*k* according to the present embodiment is different from the fourth embodiment in that the light-emitting element 9*c* includes the electron transport layer 26*a* instead of the electron injection layer 15*a*, and also in that a second cooling element 10*j* includes an extending portion 26*b* of the electron transport layer instead of the extending portion 15*b* of the electron injection layer. Other configurations are as described in the fourth embodiment. For convenience of explanation, members having the same functions as those of the members illustrated in the drawings in the fourth embodiment are denoted by the same reference numerals, and descriptions thereof will be omitted.

Figure 24:
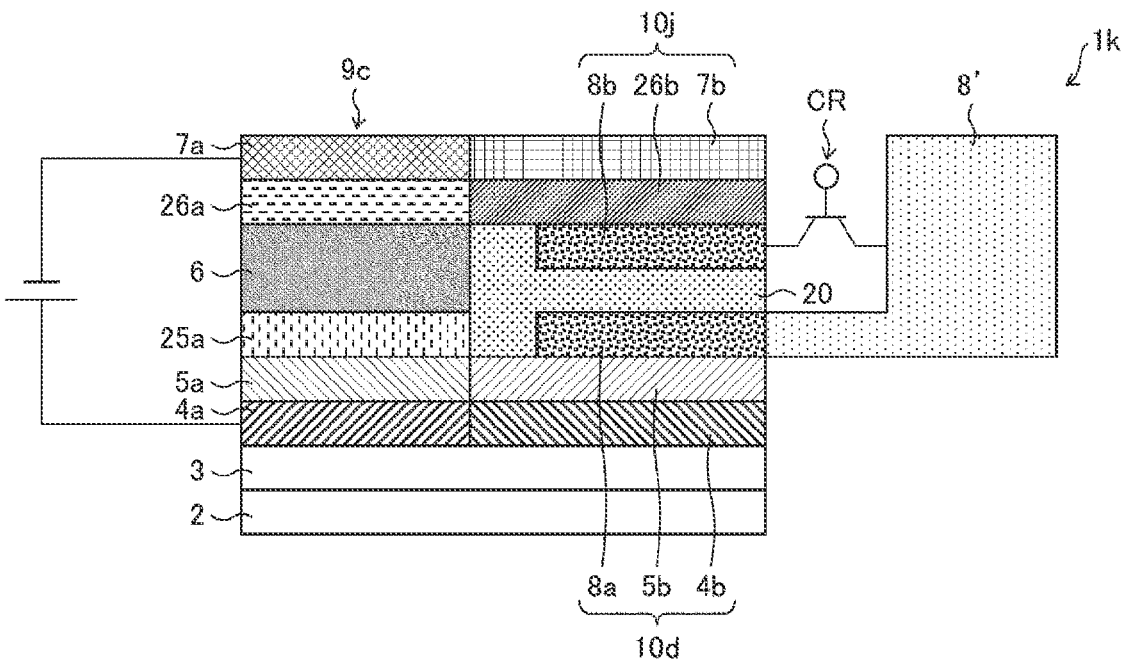
FIG. 24 is a cross-sectional view illustrating a schematic configuration of a light-emitting element, a first cooling element, and a second cooling element provided in a display device according to a seventh embodiment.

FIG. 24 is a cross-sectional view illustrating a schematic configuration of the light-emitting element 9c, the first cooling element 10d, and the second cooling element 10j provided in the display device 1k.

As illustrated in FIG. 24, the light-emitting element 9c includes the hole injection layer 5a, the hole transport layer 25a, and the electron transport layer 26a. Then, the second cooling element 10j includes the heat radiating electrode 8b for the second cooling element, the extending portion 7b of the cathode, and the extending portion 26b of the electron transport layer that is in contact with the heat radiating electrode 8b for the second cooling element and the extending portion 7b of the cathode.

Note that, as the hole transport layer 25a, any material may be used as long as the valence band level of the hole transport layer 25a is higher than the valence band level of the hole injection layer 5a and the extending portion 5b of the hole injection layer.

Further, since the extending portion 26b of the electron transport layer is formed by extending the electron transport layer 26a, the electron transport layer 26a and the extending portion 26b of the electron transport layer are formed of the same material.

Note that the electron transport layer 26a and the extending portion 26b of the electron transport layer are an n-type semiconductor layer formed of an n-type semiconductor material.

The electron transport layer 26a and the extending portion 26b of the electron transport layer, which can effectively inject electrons into the light-emitting layer 6 provided in the light-emitting element 9c and which exhibit a favorable Peltier effect, are preferably formed of, for example, at least one of $Al_XZn_{1-X}O$, $Ga_XZn_{1-X}O$ and $In_XZn_{1-X}O$ ($0<X<0.01$), all of which have a lower carrier density than $Al_XZn_{1-X}O$, $Ga_XZn_{1-X}O$, and $In_XZn_{1-X}O$ (X is from 0.01 to 0.9) described above in the second embodiment, $Mg_XZn_{1-X}O$ (X is from 0.01 to 0.9), and $Li_XZn_{1-X}O$ (X is from 0.01 to 0.9).

In the display device 1k, the first cooling element 10d and the second cooling element 10j including the extending portion 26b of the electron transport layer can be individually controlled. Further, in accordance with the calorific value of the light-emitting element 9c, the cooling amounts of the first cooling element 10d and the second cooling element 10j can be appropriately adjusted.

Eighth Embodiment

Next, an eighth embodiment of the disclosure will be described with reference to FIG. 25. A display device 1l according to the present embodiment is different from the seventh embodiment in that the light-emitting element 9d further includes the electron injection layer 15a, and also in that the second cooling element 10k includes the extending portion 15b of the electron injection layer along with the extending portion 26b of the electron transport layer. Other configurations are as described in the seventh embodiment. For convenience of explanation, components having the same functions as those described in diagrams of the seventh embodiment are denoted by the same reference numerals, and descriptions thereof will be omitted.

Figure 25:
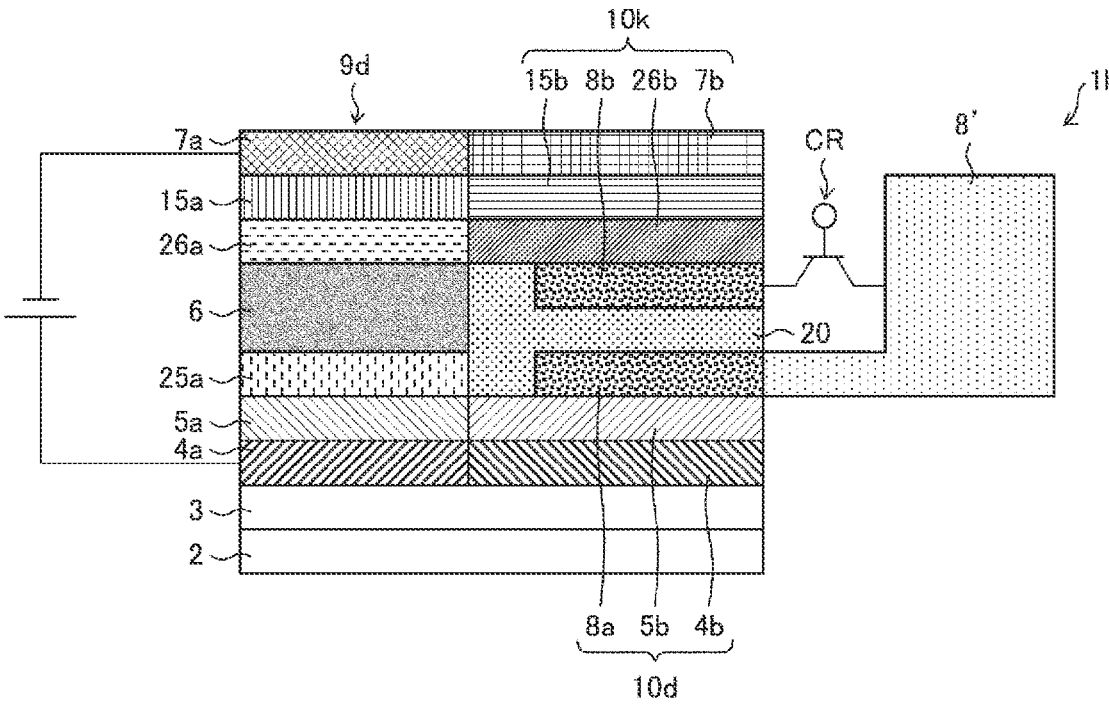
FIG. 25 is a cross-sectional view illustrating a schematic configuration of a light-emitting element, a first cooling element, and a second cooling element provided in a display device according to an eighth embodiment.
Figure 26:
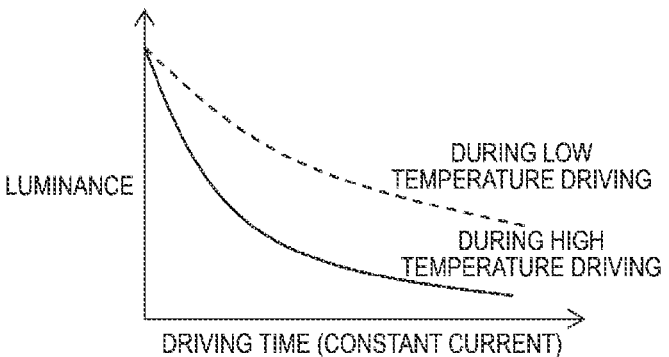
FIG. 26 is a diagram illustrating how the luminance tends to decrease over the driving time, when an OLED or a QLED is driven at low temperature and at high temperature.

FIG. 25 is a cross-sectional view illustrating a schematic configuration of the light-emitting element 9d, the first cooling element 10d, and a second cooling element 10k provided in the display device 1l.

As illustrated in FIG. 25, the light-emitting element 9d includes the hole injection layer 5a, the hole transport layer 25a, the electron transport layer 26a, and the electron injection layer 15a. Note that the light-emitting element 9d includes a layered body formed of the electron transport layer 26a and the electron injection layer 15a, as an n-type semiconductor layer (second function layer) that is provided between the cathode 7a and the light-emitting layer 6 and in contact with the cathode 7a. Then, the second cooling element 10k includes the heat radiating electrode 8b for the second cooling element, the extending portion 7b of the cathode, and a layered body formed of the extending portion 26b of the electron transport layer and the extending portion 15b of the electron injection layer, which serves as an extending portion of an n-type semiconductor layer (an extending portion of a second function layer) in contact with the heat radiating electrode 8b for the second cooling element and the extending portion 7b of the cathode.

Note that the materials described above in the seventh embodiment can be used for the electron transport layer 26a and the extending portion 26b of the electron transport layer. Note that, in the present embodiment, materials are selected for the electron transport layer 26a and the extending portion 26b of the electron transport layer such that the conduction band level of the electron transport layer 26a and the extending portion 26b of the electron transport layer is higher than the conduction band level of the electron injection layer 15a and the extending portion 15b of the electron injection layer. Further, as the hole transport layer 25a, any material may be used as long as the valence band level of the hole transport layer 25a is higher than the valence band level of the hole injection layer 5a and the extending portion 5b of the hole injection layer.

In the display device 1l, the first cooling element 10d, and the second cooling element 10k including the layered body formed of the extending portion 26b of the electron transport layer and the extending portion 15b of the electron injection layer can be individually controlled. Further, in accordance with the calorific value of the light-emitting element 9d, the cooling amounts of the first cooling element 10d and the second cooling element 10k can be appropriately adjusted.

Supplement

First Aspect

A display device including a light-emitting element including a first electrode, a second electrode, a light-emitting layer provided between the first electrode and the second electrode, and a first function layer provided between the light-emitting layer and the second electrode and being in contact with the second electrode, and a first cooling element including a third electrode, an extending portion of the second electrode, the extending portion at least partially overlapping the third electrode, and an extending portion of the first function layer, the extending portion overlapping the extending portion of the second electrode and being in contact with the extending portion of the second electrode and with the third electrode.

According to the configuration described above, the first cooling element can be driven as a Peltier element to cool the extending portion of the second electrode and also to cause the third electrode to generate heat. Then, in the light-emitting element, the light-emitting layer and the first function layer can be cooled by heat transfer via the second electrode, and thus degradation of the light-emitting layer and the first function layer due to heat, that is, degradation of the light-emitting element due to heat can be efficiently suppressed.

Further, according to the configuration described above, the first cooling element includes the extending portion of the second electrode and the extending portion of the first function layer, which are formed by extending the second electrode and the first function layer provided in the light-emitting element, respectively. Therefore, it is not necessary to prepare the first cooling element and the light-emitting element separately and assemble them together, and thus, a reduction in the manufacturing costs of the display device and a reduction in the thickness of the display device can be achieved.

Second Aspect

The display device according to the first aspect, in which the light-emitting element further includes a second function layer provided between the first electrode and the light-emitting layer and being in contact with the first electrode, and the display device further includes a second cooling element including the third electrode, an extending portion of the first electrode, the extending portion at least partially overlapping the third electrode, and an extending portion of the second function layer, the extending portion overlapping the extending portion of the first electrode and being in contact with the extending portion of the first electrode and with the third electrode.

According to the configuration described above, the second cooling element is provided in addition to the first cooling element, and the second cooling element can be driven as a Peltier element to cool the extending portion of the first electrode and also to cause the third electrode to generate heat. Then, in the light-emitting element, the light-emitting layer, the first function layer, and the second function layer can be cooled by heat transfer via the first electrode and the second electrode, and thus degradation of the light-emitting layer, the first function layer, and the second function layer due to heat, that is, degradation of the light-emitting element due to heat can be efficiently suppressed.

Further, according to the configuration described above, the first cooling element and the second cooling element include the extending portion of the first electrode, the extending portion of the second electrode, the extending portion of the first function layer, and the extending portion of the second function layer, which are formed by extending the first electrode, the second electrode, the first function layer, and the second function layer, all of which are provided in the light-emitting element, respectively. Therefore, it is not necessary to prepare the first cooling element and the second cooling element, and the light-emitting element separately and assemble them together, and thus, a reduction in the manufacturing costs of the display device and a reduction in the thickness of the display device can be achieved.

Further, according to the configuration described above, a voltage applied between the first electrode and the second electrode to drive the light-emitting element is applied between the extending portion of the first electrode and the extending portion of the second electrode as it is, and the first cooling element and the second cooling element can be driven by the voltage. Thus, the number of power sources required can be reduced.

Third Aspect

The display device according to the first aspect, in which the first electrode is a cathode, the second electrode is an anode, the first function layer is a p-type semiconductor layer, and at least one of the third electrode and a conductive member electrically connected to the third electrode is exposed to the air.

According to the configuration described above, the first cooling element including the extending portion of the p-type semiconductor layer can be driven as a Peltier element to cool the extending portion of the anode and also to cause the third electrode to generate heat. Then, since the third electrode generating heat is air-cooled as a result of exposure, to the air, of at least one of the third electrode and the conductive member electrically connected to the third electrode, the cooling effect of the anode can be improved. Thus, in the light-emitting element, the p-type semiconductor layer and the light-emitting layer can be cooled by heat transfer via the anode, and thus degradation of the light-emitting element due to heat can be suppressed.

Fourth Aspect

In the display device according to the second aspect, the first electrode is a cathode, the second electrode is an anode, the first function layer is a p-type semiconductor layer, the second function layer is an n-type semiconductor layer, and at least one of the third electrode and a conductive member electrically connected to the third electrode is exposed to the air.

According to the configuration described above, the first cooling element including the extending portion of the p-type semiconductor layer can be driven as the Peltier element to cool the extending portion of the anode and also to cause the third electrode to generate heat. Further, the second cooling element including the extending portion of the n-type semiconductor layer can be driven as the Peltier element to cool the extending portion of the cathode and also to cause the third electrode to generate heat. Then, since the third electrode generating the heat is air-cooled as a result of exposure, to the air, of at least one of the third electrode and a conductive member electrically connected to the third electrode, the cooling effect of the cathode and the anode can be improved. Thus, in the light-emitting element, the p-type semiconductor layer, the n-type semiconductor layer, and the light-emitting layer can be cooled by heat transfer via the cathode and the anode, and thus degradation of the light-emitting element due to beat can be suppressed.

Fifth Aspect

In the display device according to the first aspect, the first electrode is an anode, the second electrode is a cathode, the first function layer is an n-type semiconductor layer, and at least one of the third electrode and a conductive member electrically connected to the third electrode is exposed to the air.

According to the configuration described above, the first cooling element including the extending portion of the n-type semiconductor layer can be driven as the Peltier element to cool the extending portion of the cathode and also to cause the third electrode to generate heat. Then, since the third electrode generating the heat is air-cooled as a result of exposure, to the air, of at least one of the third electrode and the conductive member electrically connected to the third electrode, the cooling effect of the cathode can be improved. Thus, in the light-emitting element, the n-type semiconductor layer and the light-emitting layer can be cooled by heat transfer via the cathode, and thus degradation of the light-emitting element due to heat can be suppressed.

Sixth Aspect

The display device according to any one of the third to fifth aspects includes a display region including the light-emitting element, and a frame region around the display region, and in the display device, the conductive member is exposed to the air in the frame region.

According to the configuration described above, it is not necessary to provide an opening or the like for exposing the conductive member in the display region.

Seventh Aspect

The display device according to any one of the first, third, and fifth aspects, in which a temperature of the third electrode is higher than at least one of a temperature of the first electrode and a temperature of the second electrode.

According to the configuration described above, the first cooling element functions efficiently as a Peltier element.

Eighth Aspect

In the display device according to the second or fourth aspect, a temperature of the third electrode is higher than a temperature of the first electrode and a temperature of the second electrode by 0.1° C. or more.

According to the configuration described above, the first cooling element and the second cooling element function efficiently as Peltier elements.

Ninth Aspect

The display device according to any one of the second, fourth, and eighth aspects, in which the third electrode is constituted by an electrode for the first cooling element and an electrode for the second cooling element, the electrodes being separated from each other, and the display device further includes a current controller configured to control a current flowing through the electrode for the first cooling element and a current flowing through the electrode for the second cooling element.

According to the configuration described above, since the current controller configured to control the current flowing through the electrode for the first cooling element and the current flowing through the electrode for the second cooling element, the first cooling element and the second cooling element can be controlled individually. Further, in accordance with the calorific value of the light-emitting element, the cooling amounts of the first cooling element and the second cooling element can be appropriately adjusted.

Tenth Aspect

The display device according to any one of the first to ninth aspects, in which the third electrode is formed separated from the light-emitting layer.

According to the configuration described above, the third electrode that radiates heat can be electrically and thermally isolated (insulated) from the light-emitting layer, which is an object to be cooled.

Eleventh Aspect

The display device according to the tenth aspect, in which the third electrode is formed separated from the light-emitting layer by a distance greater than or equal to four times a thickness of the first function layer and less than or equal to 10000 times a thickness of the first function layer.

According to the configuration described above, the third electrode that radiates heat can be electrically and thermally isolated (insulated) from the light-emitting layer, which is the object to be cooled. Further, the light-emitting element can be disposed satisfying at least a certain level of resolution.

Twelfth Aspect

The display device according to the tenth or eleventh aspect, in which a material containing at least one or more selected from the group consisting of silicon oxide, magnesium oxide, titanium oxide, and zirconium oxide is filled between the light-emitting layer and the third electrode.

According to the configuration described above, the third electrode that radiates heat can be electrically and thermally isolated (insulated) from the light-emitting layer, which is the object to be cooled, in a more reliable manner.

Thirteenth Aspect

The display device according to the fourth or fifth aspect, in which the n-type semiconductor layer is an electron injection layer, and the electron injection layer is formed of at least one of $Al_XZn_{1-X}O$, $Ga_XZn_{1-X}O$, and $In_XZn_{1-X}O$ (X is from 0.01 to 0.9).

According to the configuration described above, since the electron injection layer having a high Peltier performance index is provided, a display device having a higher cooling efficiency can be realized.

Fourteenth Aspect

In the display device according to the third or fourth aspect, the p-type semiconductor layer is a hole injection layer, and the hole injection layer contains at least one or more selected from the group consisting of PEDOT, PVK (poly(N-vinylcarbazole)), m-MTDATA (4,4',4"-tris[(3-methylphenyl)phenylamino]triphenylamine), TDATA (4,4',4"-tris(N,N-diphenylamino)triphenylamine), PANI (polyaniline), poly-TPD (poly[N,N'-bis(4-butylphenyl)-N,N'-bis (phenyl)benzidine]), and DPAB (4,4'-bis[N-(4-diphenylaminophenyl)-N-phenylamino]biphenyl).

According to the configuration described above, since an organic hole injection layer having a high Peltier performance index is provided, a display device having a higher cooling efficiency can be fabricated.

Fifteenth Aspect

The display device according to the third or fourth aspect, in which the p-type semiconductor layer is a hole injection layer, and the hole injection layer contains at least one or more selected from the group consisting of lithium cobalt oxide, lithium nickel oxide, sodium cobalt oxide, sodium nickel oxide, potassium cobalt oxide, potassium nickel oxide, magnesium cobalt oxide, magnesium nickel oxide, calcium cobalt oxide, and calcium nickel oxide.

According to the configuration described above, since an inorganic hole injection layer having a high Peltier performance index is provided, a display device having a higher cooling efficiency can be fabricated.

Sixteenth Aspect

The display device according to any one of the fourth, fifth, and thirteenth aspects, in which the n-type semiconductor layer is an electron injection layer, and a band gap of the electron injection layer is 1.9 eV or greater.

According to the configuration described above, a display device provided with an electron injection layer that only absorbs a small amount of light in a visible light region emitted from the light-emitting layer can be fabricated.

Seventeenth Aspect

The display device according to any one of the third, fourth, fourteenth, and fifteenth aspects, in which the p-type semiconductor layer is a hole injection layer, and a band gap of the hole injection layer is 1.9 eV or greater.

According to the configuration described above, a display device provided with a hole injection layer that only absorbs a small amount of light in the visible light region emitted from the light-emitting layer can be fabricated.

Eighteenth Aspect

The display device according to any one of the fourth, fifth, thirteenth, and sixteenth aspects, in which the n-type semiconductor layer is an electron injection layer, and an absolute value of a conduction band level of the electron injection layer is 4.8 eV or less.

According to the configuration described above, since the electron injection layer having the absolute value of the conduction band level being 4.8 eV or less is provided, a material containing at least one of Al, Ag, and ITO can be used as an electrode material.

Nineteenth Aspect

The display device according to any one of the third, fourth, fourteenth, fifteenth, and seventeenth aspects, in which the p-type semiconductor layer is a hole injection layer, and an absolute value of a valence band level of the hole injection layer is 4.5 eV or greater.

According to the configuration described above, since the hole injection layer having the absolute value of the valence band level being 4.5 eV or greater is provided, a material containing at least one of Al, Ag, and ITO can be used as an electrode material.

Twentieth Aspect

The display device according to any one of the second, fourth, eighth, and ninth aspects, in which work functions of the first electrode, the second electrode, and the third electrode are from 4.5 eV to 4.8 eV.

According to the configuration described above, a material containing at least one of Al, Ag, and ITO can be used as the electrode material.

Twenty-First Aspect

The display device according to any one of the firth to twentieth aspects, in which a film thickness of the first function layer is from 10 nm to 100 nm, and a film thickness of the extending portion of the first function layer is from 1 μm to 100 μm.

According to the configuration described above, a display device in which the film thickness of the first function layer provided in the light-emitting element and the film thickness of the extending portion of the first function layer provided in the first cooling element are optimal can be fabricated.

Twenty-Second Aspect

The display device according to any one of the second, fourth, eighth, and ninth aspects, in which a film thickness of the second function layer is from 10 nm to 100 nm, and a film thickness of the extending portion of the second function layer is from 1 μm to 100 μm.

According to the configuration described above, a display device in which the film thickness of the second function layer provided in the light-emitting element and the film thickness of the extending portion of the second function layer provided in the second cooling element are optimal can be fabricated.

Twenty-Third Aspect

The display device according to any one of the first to twenty-second aspects, in which the light-emitting layer includes a quantum dot.

According to the configuration described above, a display device provided with a quantum dot light emitting diode (QLED) can be fabricated.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The disclosure can be utilized for a display device.

The invention claimed is:

1. A display device comprising:
a light-emitting element including a first electrode, a second electrode, a light-emitting layer provided between the first electrode and the second electrode, and a first function layer provided between the light-emitting layer and the second electrode and being in contact with the second electrode; and
a first cooling element including a third electrode, an extending portion of the second electrode, and an extending portion of the first function layer, the extending portion of the second electrode at least partially overlapping the third electrode, and the extending portion of the first function layer overlapping the extending portion of the second electrode and being in contact with the extending portion of the second electrode and with the third electrode, wherein
the extending portion of the second electrode is formed by extending the second electrode, and the second electrode and the extending portion of the second electrode are formed of a same material and also electrically connected to each other, and
the extending portion of the first function layer is formed by extending the first function layer, and the first function layer and the extending portion of the first function layer are formed of a same material and also electrically connected to each other.

2. The display device according to claim 1,
wherein the light-emitting element further includes a second function layer provided between the first electrode and the light-emitting layer and being in contact with the first electrode, and
the display device further comprises a second cooling element including the third electrode, an extending portion of the first electrode, and an extending portion of the second function layer, the extending portion of the first electrode at least partially overlapping the third electrode, and the extending portion of the second function layer overlapping the extending portion of the first electrode and being in contact with the extending portion of the first electrode and with the third electrode.

3. The display device according to claim 1,
wherein the first electrode is a cathode and the second electrode is an anode,
the first function layer is a p-type semiconductor layer, and
at least one of the third electrode and a conductive member electrically connected to the third electrode is exposed to air.

4. The display device according to claim 2,
wherein the first electrode is a cathode and the second electrode is an anode,
the first function layer is a p-type semiconductor layer,
the second function layer is an n-type semiconductor layer, and
at least one of the third electrode and a conductive member electrically connected to the third electrode is exposed to air.

5. The display device according to claim 1,
wherein the first electrode is an anode and the second electrode is a cathode,
the first function layer is an n-type semiconductor layer, and
at least one of the third electrode and a conductive member electrically connected to the third electrode is exposed to air.

6. The display device according to claim 3, further comprising:
a display region including the light-emitting element; and
a frame region around the display region,
wherein the conductive member is exposed to the air in the frame region.

7. The display device according to claim 1, wherein a temperature of the third electrode is higher than at least one of a temperature of the first electrode and a temperature of the second electrode.

8. The display device according to claim 2, wherein a temperature of the third electrode is higher than a temperature of the first electrode and a temperature of the second electrode by 0.1° C. or more.

9. The display device according to claim 2, wherein the third electrode is formed by an electrode for the first cooling element and an electrode for the second cooling element, the electrode for the first cooling element is separated from the electrode for the second cooling element, and the display device further comprises a current controller configured to control a current flowing through the electrode for the first cooling element and a current flowing through the electrode for the second cooling element.

10. The display device according to claim 1, wherein the third electrode is formed such that to be separated from the light-emitting layer.

11. The display device according to claim 10, wherein the third electrode is separated from the light-emitting layer by a distance greater than or equal to four times a thickness of the first function layer, and less than or equal to 10000 times the thickness of the first function layer.

12. The display device according to claim 10, wherein a material, containing at least one or more selected from the group consisting of silicon oxide, magnesium oxide, titanium oxide, and zirconium oxide, is filled between the light-emitting layer and the third electrode.

13. The display device according to claim 4, wherein the n-type semiconductor layer is an electron injection layer, and the electron injection layer is formed of at least one of $Al_XZn_{1-X}O$, $Ga_XZn_{1-X}O$, and $In_XZn_{1-X}O$, wherein X is a number from 0.01 to 0.9.

14. The display device according to claim 3, wherein the p-type semiconductor layer is a hole injection layer, and the hole injection layer contains at least one or more selected from the group consisting of PEDOT, PVK (poly(N-vinylcarbazole)), m-MTDATA (4,4',4"-tris[(3-methylphenyl)phenylamino]triphenylamine), TDATA (4,4',4"-tris(N,N-diphenylamino)triphenylamine), PANI (polyaniline), poly-TPD (poly[N,N'-bis(4-butylphenyl)-N,N'-bis(phenyl)benzidine]), and DPAB (4,4'-bis[N-(4-diphenylaminophenyl)-N-phenylamino] biphenyl).

15. The display device according to claim 3, wherein the p-type semiconductor layer is a hole injection layer, and the hole injection layer contains at least one or more selected from the group consisting of lithium cobalt oxide, lithium nickel oxide, sodium cobalt oxide, sodium nickel oxide, potassium cobalt oxide, potassium nickel oxide, magnesium cobalt oxide, magnesium nickel oxide, calcium cobalt oxide, and calcium nickel oxide.

16. The display device according to claim 4, wherein the n-type semiconductor layer is an electron injection layer, and a band gap of the electron injection layer is 1.9 eV or greater.

17. The display device according to claim 3, wherein the p-type semiconductor layer is a hole injection layer, and a band gap of the hole injection layer is 1.9 eV or greater.

18. The display device according to claim 2, wherein work functions of the first electrode, the second electrode, and the third electrode are from 4.5 eV to 4.8 eV.

19. The display device according to claim 1, wherein a film thickness of the first function layer is from 10 nm to 100 nm, and a film thickness of the extending portion of the first function layer is from 1 μm to 100 μm.

20. The display device according to claim 2, wherein a film thickness of the second function layer is from 10 nm to 100 nm, and a film thickness of the extending portion of the second function layer is from 1 μm to 100 μm.

* * * * *